US012125953B2

(12) United States Patent
Sasaoka et al.

(10) Patent No.: US 12,125,953 B2
(45) Date of Patent: Oct. 22, 2024

(54) METHOD FOR MANUFACTURING LIGHT EMITTING DEVICE, LIGHT EMITTING DEVICE, AND LIGHT EMITTING MODULE

(71) Applicant: NICHIA CORPORATION, Anan (JP)

(72) Inventors: Shimpei Sasaoka, Itano-gun (JP); Toshiyuki Hashimoto, Anan (JP); Toshinobu Katsumata, Fujiyoshida (JP); Naoya Kashiwagi, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 395 days.

(21) Appl. No.: 17/456,556

(22) Filed: Nov. 24, 2021

(65) Prior Publication Data

US 2022/0173285 A1    Jun. 2, 2022

(30) Foreign Application Priority Data

Nov. 30, 2020  (JP) .................................. 2020-198901
Feb. 26, 2021  (JP) .................................. 2021-030773

(51) Int. Cl.
*H01L 33/54*   (2010.01)
*H01L 33/00*   (2010.01)
*H01L 33/48*   (2010.01)
*H01L 33/56*   (2010.01)

(52) U.S. Cl.
CPC ............ *H01L 33/54* (2013.01); *H01L 33/005* (2013.01); *H01L 33/486* (2013.01); *H01L 33/56* (2013.01); *H01L 2933/005* (2013.01)

(58) Field of Classification Search
CPC ........................... H10K 59/131; H10K 59/353
See application file for complete search history.

(56) References Cited

U.S. PATENT DOCUMENTS 9,786,826 B2 * 10/2017 Yasuhara ................ H01L 33/60
2006/0078246 A1    4/2006 Ashida
2010/0259706 A1   10/2010 Kuwaharada et al.
(Continued)

FOREIGN PATENT DOCUMENTS

JP    2000252524 A    9/2000
JP    2006106479 A    4/2006
(Continued)

*Primary Examiner* — Evren Seven
(74) *Attorney, Agent, or Firm* — Hunton Andrews Kurth LLP

(57) ABSTRACT

A method for manufacturing a light emitting device according to the present invention includes: providing an intermediate member including: a support member including: housing portions, the housing portions having first recessed portion(s) each having a lateral wall and a bottom surface, and a coupling portion located between adjacent ones of the housing portions and having a height lower than a height of the lateral wall with reference to the bottom surface of the first recessed portion, a light source mounted on the bottom surface of the first recessed portion, and an encapsulant disposed in the first recessed portion; and forming a first light-transmissive member continuously covering the housing portions and the coupling portion. An inclined surface of the first light-transmissive member has a height above the coupling portion is lower than a height above the housing portions with reference to the bottom surface of the first recessed portion.

17 Claims, 14 Drawing Sheets

(56) References Cited

U.S. PATENT DOCUMENTS

| | | |
|---|---|---|
| 2011/0063850 A1 | 3/2011 | Oide et al. |
| 2011/0291131 A1 | 12/2011 | Ito |
| 2013/0121000 A1* | 5/2013 | Lee .................. H01L 33/56 362/293 |
| 2013/0170208 A1* | 7/2013 | Kuwaharada ...... G02B 19/0028 362/243 |
| 2017/0069801 A1* | 3/2017 | Oka .................. H01L 33/486 |
| 2020/0111766 A1 | 4/2020 | Kawano |
| 2020/0135991 A1 | 4/2020 | Lin et al. |

FOREIGN PATENT DOCUMENTS

| | | |
|---|---|---|
| JP | 2008147270 A | 6/2008 |
| JP | 2008270144 A | 11/2008 |
| JP | 2009272251 A | 11/2009 |
| JP | 2011171765 A | 9/2011 |
| JP | 2011187979 A | 9/2011 |
| JP | 2011233645 A | 11/2011 |
| JP | 2012019149 A | 1/2012 |
| JP | 2012142621 A | 7/2012 |
| JP | 2012216764 A | 11/2012 |
| JP | 2012227203 A | 11/2012 |
| JP | 2013106047 A | 5/2013 |
| JP | 2013225713 A | 10/2013 |
| JP | 2016081649 A | 5/2016 |
| JP | 2017054894 A | 3/2017 |
| JP | 2017054929 A | 3/2017 |
| JP | 2018088554 A | 6/2018 |
| JP | 2020061543 A | 4/2020 |
| JP | 2020072264 A | 5/2020 |
| WO | 2009157166 A1 | 12/2009 |
| WO | 2010095441 A1 | 8/2010 |
| WO | 2012/049854 A1 | 4/2012 |

* cited by examiner

METHOD FOR MANUFACTURING LIGHT EMITTING DEVICE, LIGHT EMITTING DEVICE, AND LIGHT EMITTING MODULE

CROSS-REFERENCE TO RELATED APPLICATION

This application claims priority to Japanese Patent Application No. 2020-198901, filed on Nov. 30, 2020, and Japanese Patent Application No. 2021-030773 filed on Feb. 26, 2021, the disclosures of which are hereby incorporated by reference in their entireties.

BACKGROUND

The present disclosure relates to a method for manufacturing a light emitting device, a light emitting device, and a light emitting module.

A light emitting device including a light emitting element such as a light emitting diode is known (See, for example, Japanese Patent Publication No. 2013-106047). As an example, the following light emitting device is known. The light emitting device includes a reflective first body that is disposed on a plurality of leads and has a region open in a predetermined region among upper surface regions of the plurality of leads, a light transmissive second body that has a first opening corresponding to the open region of the first body and is disposed on an upper surface of the first body, a light emitting chip disposed on at least one of the plurality of lead frames exposed from the first opening of the second body, and a first resin layer that is disposed in the first opening of the second body and covers the light emitting chip. In such a light emitting device, there is a demand for a reduction in thickness.

SUMMARY

An exemplary object of the present disclosure is to provide a method for manufacturing a light emitting device that affords a thinner light emitting device, such a light emitting device, and a light emitting module.

A method for manufacturing a light emitting device according to a certain embodiment of the present disclosure includes: providing an intermediate member including: a support member including: a plurality of housing portions, at least one of the housing portions having a first recessed portion that has a lateral wall and a bottom surface, and a coupling portion located between the at least one of the housing portions and an adjacent one of the housing portions and having a height lower than a height of the lateral wall with reference to the bottom surface of the first recessed portion, a light source mounted on the bottom surface of the first recessed portion, and an encapsulant disposed in the first recessed portion and covering the light source; and forming a first light-transmissive member that continuously covers at least one of the housing portions and the coupling portion. A surface of the first light-transmissive member has an inclined surface, wherein a height of the inclined surface above the coupling portion is lower than a height of the inclined surface above the at least one of the housing portions with reference to the bottom surface of the first recessed portion.

A light emitting device according to a certain embodiment of the present disclosure includes: a light source; an encapsulant that covers a light emitting surface and a lateral surface of the light source; and a light-transmissive member that covers an upper surface and a lateral surface of the encapsulant. The light-transmissive member has an octagon shape in a plan view. All interior angles of the octagonal shape are less than 180 degrees, and at least one of the interior angles is different from another of the interior angles.

A light emitting module according to a certain embodiment of the present disclosure includes: a substrate on which the light emitting device according to an embodiment of the present disclosure; and a partition member that is disposed on the same side of the substrate where the light emitting device is disposed, and includes a wall portion surrounding the light emitting device in a plan view.

According to an embodiment of the present disclosure, a method for manufacturing a light emitting device that affords a thinner light emitting device can be provided, such a light emitting device, and a light emitting module.

Figure 1:
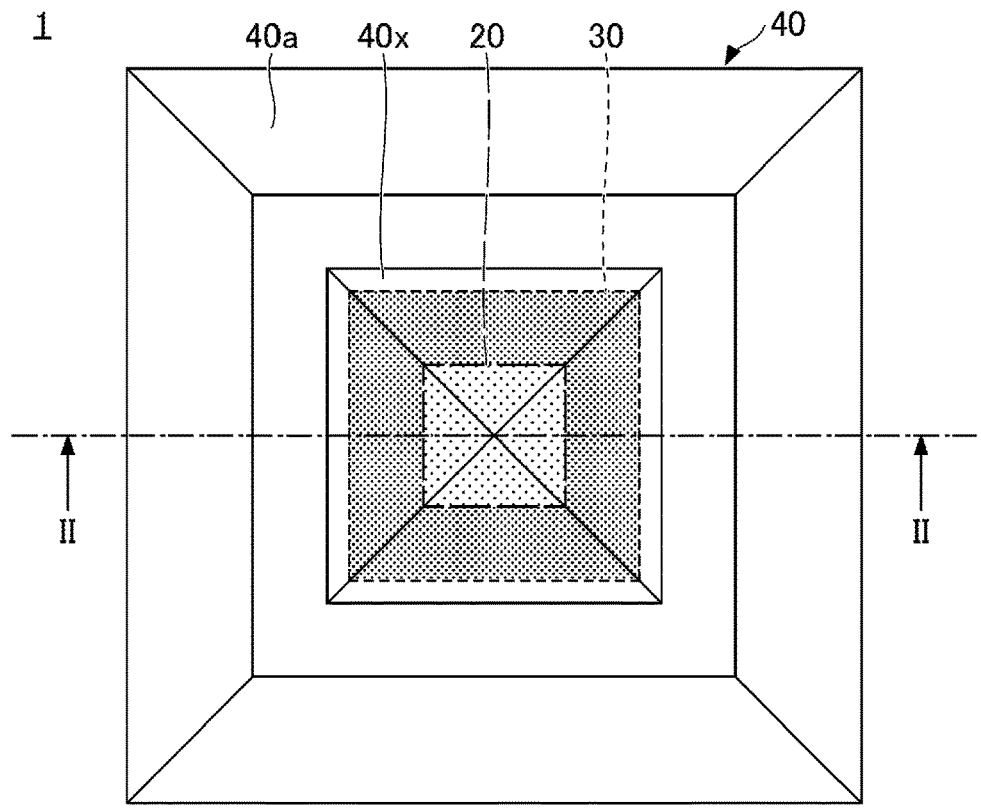
FIG. 1 is a schematic plan view exemplifying a light emitting device according to a first embodiment of the present disclosure.

Hereinafter, embodiments for carrying out the invention will be described with reference to the drawings. Note that, in the following description, terms indicating a specific direction or position (for example, "upper", "lower", and other terms including or related to those terms) are used when needed, but these terms are used to facilitate understanding of the invention with reference to the drawings, and the technical scope of the present invention is not limited by the meaning of these terms. In addition, parts having the same reference numerals appearing in a plurality of drawings indicate identical or equivalent parts or members.

Further, the following embodiments exemplify a light emitting device and the like for embodying a technical concept of the present invention, and the present invention is not limited to the description below. In addition, unless otherwise specified, the dimensions, materials, shapes, relative arrangements, and the like of constituent elements described below are not intended to limit the scope of the present invention to those alone and are merely exemplary. Additionally, the contents described in one embodiment can be applied to other embodiments and modification examples.

Further, the size, positional relationship, and the like of the members illustrated in the drawings can be exaggerated in order to clarify the explanation. Furthermore, in order to avoid excessive complication of the drawings, a schematic view in which some elements are not illustrated may be used, or an end view illustrating only a cutting surface may be used as a cross-sectional view.

FIRST EMBODIMENT

Light Emitting Device 1

Figure 2:
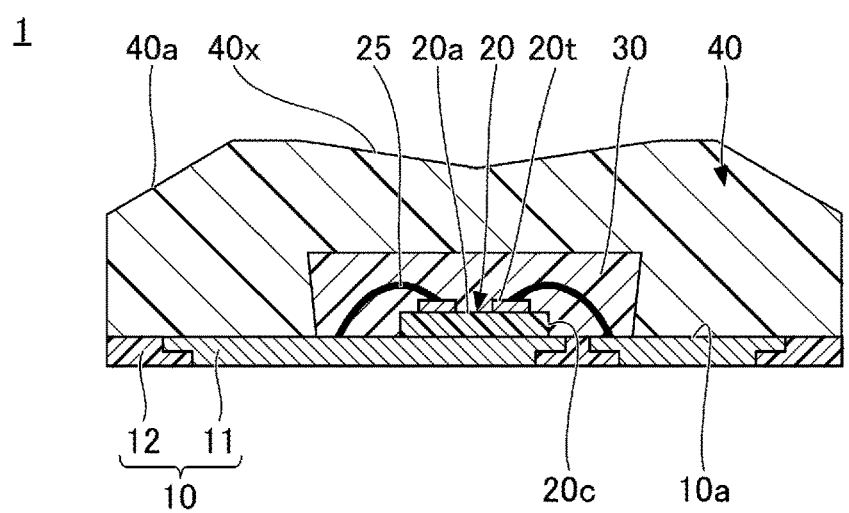
FIG. 2 is a schematic cross-sectional view taken along line II-II in FIG. 1 exemplifying the light emitting device according to the first embodiment.

FIG. 1 is a schematic plan view exemplifying a light emitting device according to a first embodiment. FIG. 2 is a schematic cross-sectional view taken along line II-II in FIG. 1 exemplifying the light emitting device according to the first embodiment.

As illustrated in FIGS. 1 and 2, a light emitting device 1 includes a substrate 10, a light source 20, an encapsulant 30, and a light-transmissive member 40. However, the substrate 10 is a member provided as necessary, and is not an essential component of the light emitting device 1.

In the light emitting device 1, the light source 20 is mounted on an upper surface 10a side of the substrate 10. The light source 20 includes an upper surface 20a and at least a lateral surface 20c. Light from the light source 20 is emitted from the upper surface 20a, and is also emitted from the lateral surface 20c. The encapsulant 30 is provided on the upper surface 10a side of the substrate 10, and covers the upper surface 20a and the lateral surface 20c of the light source 20. The light-transmissive member 40 is provided on the upper surface 10a side of the substrate 10, covers the encapsulant 30, and is located above the upper surface 20a of the light source 20 and to the lateral side of the lateral surface 20c. In the light emitting device 1, light from the light source 20 is emitted in an upper direction and a lateral direction of the light-transmissive member 40 through the encapsulant 30 and the light-transmissive member 40. Each element constituting the light emitting device 1 will be described below in detail.

Substrate 10

The substrate 10 includes a pair of leads 11 and an insulating member 12. Most of a periphery of each of the leads 11 is embedded with the insulating member 12, and a part of the periphery is exposed from the insulating member 12. Further, an upper surface and a lower surface of each of the leads 11 are exposed from the insulating member 12. For example, the upper surface of each of the leads 11 and an upper surface of the insulating member 12 are in the same plane, and the lower surface of each of the leads 11 and a lower surface of the insulating member 12 are in the same plane. The lower surface of each of the leads 11 is, for example, an external connection terminal.

As a base material constituting the lead 11, for example, a plate-like body formed of at least one kind of metal selected from copper, aluminum, gold, silver, tungsten, iron, and nickel, an alloy such as an iron-nickel alloy and phosphor bronze, and a clad material can be used. Silver, aluminum, gold, an alloy thereof, or a film of metal (for example, a film formed by plating) comprising silver may be formed on a surface of the lead 11 in order to efficiently extract light from the light source 20. The film of metal formed on the surface of the lead 11 may be a single layer film or a multilayer film.

The material of the insulating member 12 preferably has good light reflectivity, and examples of the material include a white resin in which white powder being an additive that reflects light, a filler, a diffusion agent, a reflective material, and the like is added to a transparent resin. The insulating member 12 is preferably a silicone resin containing inorganic white powder such as titanium oxide. When the insulating member 12 includes a resin containing a light reflective material, exit of light to the substrate side is suppressed. The insulating member 12 preferably has reflectivity equal to or greater than 60%, more preferably reflectivity equal to or greater than 90%, with respect to light emitted from the light source 20.

Light Source 20

The light source 20 is, for example, a light emitting element. Alternatively, a light emitting device including a light emitting element and another member may be used as the light source 20. In the present embodiment, a light emitting element having the upper surface 20a and the lateral surface 20c is exemplified as the light source 20. The light source 20 has, for example, a rectangle shape in a plan view.

The light source 20 includes, for example, a pair of electrodes 20t on the upper surface 20a side, and the pair of electrodes 20t of the light source 20 and the pair of leads 11 of the substrate 10 are electrically connected by metal wires 25. Examples of a material of the metal wire 25 include a metal such as gold, silver, copper, platinum, and aluminum, and an alloy thereof, but gold having good thermal conductivity and the like is preferably used in particular. The thickness of the metal wire 25 can be appropriately selected depending on the purpose and application.

When the light source 20 is a light emitting element, or when the light source 20 includes a light emitting element and another member, a typical example of the light emitting element is a light emitting diode (LED). The light emitting element includes, for example, an element substrate such as sapphire or gallium nitride, and a semiconductor layered body. The semiconductor layered body includes an n-type semiconductor layer, a p-type semiconductor layer, an active layer sandwiched between the n-type semiconductor layer and the p-type semiconductor layer, and electrodes electrically connected to the n-type semiconductor layer and the p-type semiconductor layer. The semiconductor layered body may include a nitride-based semiconductor ($In_XAl_YGa_{1-X-Y}N$, $0 \leq X$, $0 \leq Y$, and $X+Y \leq 1$) that can emit light in an ultraviolet region to a visible region.

The semiconductor layered body can include at least one light emitting layer that can emit light in the ultraviolet region to the visible region as described above. For example, the semiconductor layered body can include a light emitting layer that can emit light in one light emission color or one light emission wavelength between the n-type semiconductor layer and the p-type semiconductor layer. Note that the light emitting layer may have a double heterojunction structure, a single quantum well structure (SQW), or a multiple quantum well structure (MQW).

The semiconductor layered body can also include a plurality of light emitting layers. For example, the semiconductor layered body may have a structure including a plurality of light emitting layers between the n-type semiconductor layer and the p-type semiconductor layer, or may have a structure in which the n-type semiconductor layer, the light emitting layer, and the p-type semiconductor layer are sequentially repeated multiple times. The plurality of light emitting layers may include active layers having light emission colors different from each other or light emission wavelengths different from each other, or may include active layers having the same light emission color each other or the same light emission wavelength each other. Note that the same light emission color may have a variation in a range to be considered as the same light emission color for use, for example, approximately several nm at a main wavelength.

A combination of light emission colors or light emission wavelengths can be appropriately selected. For example, when the semiconductor layered body includes two active layers, examples of a combination of light emission colors include blue light and blue light, green light and green light, red light and red light, ultraviolet light and ultraviolet light, blue light and green light, blue light and red light, and green light and red light.

Encapsulant 30

The encapsulant 30 has a rectangle shape larger than that of the light source 20 in plan view. The center of the encapsulant 30 preferably matches an optical axis of the light source 20 in plan view. Here, the optical axis of the light source 20 is defined as a line that passes through the center of the upper surface 20a of the light source 20 and perpendicularly intersects the upper surface 20a. In plan view, each vertex of the rectangle shape of the encapsulant 30 is located on, for example, an extended line of a diagonal line of the rectangle shape of the light source 20. In other words, the light source 20 and the encapsulant 30 have, for example, similar shapes.

A resin having good heat resistance, weather resistance, and light resistance is preferably used as the encapsulant 30. Examples of such a resin include a silicone resin, a modified silicone resin, an epoxy resin, a modified epoxy resin, a urea resin, a phenol resin, an acrylic resin, a urethane resin, a fluororesin, or a resin containing two or more kinds of these resins.

The encapsulant 30 can be mixed with at least one kind selected from the group consisting of a filler, a diffusion agent, a pigment, a fluorescent material, and a reflective material in order to impart a predetermined function. Barium titanate, titanium oxide, aluminum oxide, silicon oxide, and the like can be suitably used as the diffusion agent. Further, the encapsulant 30 may contain an organic or inorganic coloring dye or coloring pigment for the purpose of blocking a wavelength except for a desired wavelength. Further, the encapsulant 30 may contain a phosphor.

The encapsulant 30 functions as a wavelength conversion member when the encapsulant 30 contains the phosphor. The wavelength conversion member absorbs at least a part of light emitted from the light source 20, and emits light having a wavelength different from a wavelength of the light emitted from the light source 20. For example, the wavelength conversion member converts a wavelength of a part of blue light from the light source 20, and emits yellow light. According to such a configuration, white light is obtained by mixing blue light that has passed through the wavelength conversion member and yellow light emitted from the wavelength conversion member.

Phosphors known in the art may be used. Specifically, an yttrium aluminum garnet based phosphor (for example, $Y_3(Al,Ga)_5O_{12}$:Ce), a lutetium aluminum garnet based phosphor (for example, $Lu_3(Al,Ga)_5O_{12}$:Ce), a terbium aluminum garnet based phosphor (for example, $Tb_3(Al,Ga)_5O_{12}$:Ce), a CCA based phosphor (for example, $Ca_{10}(PO_4)_6Cl_2$:Eu), an SAE based phosphor (for example, $Sr_4Al_{14}O_{25}$:Eu), a chlorosilicate based phosphor (for example, $Ca_8MgSi_4O_{16}Cl_2$:Eu), a β-SiALON based phosphor (for example, $(Si,Al)_3(O,N)_4$:Eu), an α based SiAlON phosphor (for example, $Ca(Si,Al)_{12}(O,N)_{16}$:Eu), an SLA based phosphor (for example, $SrLiAl_3N_4$:Eu), a nitride based phosphor such as a CASN based phosphor (for example, $CaAlSiN_3$:Eu) or an SCASN based phosphor (for example, $(Sr,Ca)AlSiN_3$:Eu), a fluoride phosphor such as a KSF based phosphor (for example, $K_2SiF_6$:Mn), a KSAF based phosphor (for example, $K_2Si_{0.99}Al_{0.01}F_{5.99}$:Mn), or an MGF based phosphor (for example, $3.5MgO \cdot 0.5MgF_2 \cdot GeO_2$:Mn), a phosphor having a perovskite structure (for example, $CsPb(F,Cl,Br,I)_3$), a quantum dot phosphor (for example, CdSe, InP, $AgInS_2$, or $AgInSe_2$), or the like can be used.

The planar shape of the encapsulant 30 may be various shapes such as a rectangular shape and a circular shape, but the encapsulant 30 preferably has a rectangular shape. When the encapsulant 30 contains a phosphor, the planar shape of the light source 20 is a rectangular shape, and the planar shape of the encapsulant 30 is also a rectangular shape larger than the planar shape of the light source, a distance in which light passes through the encapsulant 30 in a diagonal line direction of the light source and the distance in a direction perpendicular to each one side can be set substantially the same. As a result, the color of light having a wavelength converted by the phosphor in the diagonal line direction is substantially the same as that in the direction perpendicular to one side, and unevenness in color of the light emitting device 1 can be reduced.

Light-Transmissive Member 40

A resin having good heat resistance, weather resistance, and hardness is preferably used as the light-transmissive member 40. Examples of such a resin include an epoxy resin, a silicone resin, a modified silicone resin, a urea resin, a urethane resin, an acrylic resin, a polycarbonate resin, or a polyimide resin, or a resin containing two or more kinds of these resins. The light-transmissive member 40 can be mixed with at least one kind selected from the group consisting of a filler, a diffusion agent, a pigment, and a reflective material in order to impart a predetermined function.

The light-transmissive member 40 has, for example, a rectangle shape in plan view. The light-transmissive member 40 has, for example, a square shape in plan view. The center of the light-transmissive member 40 preferably matches the optical axis of the light source 20 in plan view. In plan view, four vertices of the square shape of the light-transmissive member 40 are located on, for example, extended line of both the diagonal line of the rectangle shape of the light source 20 and the diagonal line of the encapsulant 30. In other words, the light source 20, the encapsulant 30, and the light-transmissive member 40 have, for example, similar shapes.

For example, in a case in which the light-transmissive member 40 is circular in plan view, directivity in each direction is uniform. In contrast, as in the present embodiment, when the light-transmissive member 40 has a square shape in plan view, directivity in the diagonal line direction of the square can be improved, and intensity of light in the diagonal line direction can be set higher than intensity of light in the direction perpendicular to the center of each side of the square and the like. This characteristic is suitable when a reflector having a rectangular shape in plan view is located around the light emitting device 1, for example.

In other words, a distance from the center of the light emitting device 1 to the four corners of the reflector having the rectangular shape in plan view is longer than a distance to another portion, and thus the four corners of the reflector tend to be dark. When the four corners of the reflector are dark, unevenness in brightness will occur. However, because the light-transmissive member 40 is a square in plan view in the light emitting device 1, the directivity in the diagonal line direction of the square is improved, and the intensity of light in the diagonal line direction is set higher than the intensity of light in the direction perpendicular to the center of each side of the square and the like. Thus, darkness at the four corners of the reflector having the rectangular shape in plan view can be suppressed, and unevenness in brightness can be reduced.

Note that the light-transmissive member 40 is not limited to having a square shape in plan view, and may be a polygon having an additional corner added to a square. For example, examples include an octagon in which the center of each side of the square illustrated in FIG. 1 is equally shifted to the outside of the square in the direction perpendicular to each side. Also in this case, the intensity of light that travels in the direction to the four corners of the reflector having the rectangular shape in plan view can be increased, and thus darkness at the four corners of the reflector can be suppressed, and unevenness in brightness can be reduced.

A surface of the light-transmissive member 40 has an inclined surface 40a having a height on a peripheral end side lower than a height on a center side with reference to the lower surface of the light source 20. The inclined surface 40a is provided in, for example, an annular shape outside the encapsulant 30 in plan view. In the light-transmissive member 40, light from the light source 20 is refracted at the inclined surface 40a, and is emitted in the lateral direction. Thus, a wide light distribution such as batwing light distribution can be achieved. The inclined surface 40a may be formed in a curved shape in a cross-sectional view, but is preferably formed linearly in the cross-sectional view. In the case in which the inclined surface 40a is formed linearly in the cross-sectional view, light emitted in the lateral direction can be increased as compared to the case in which the inclined surface 40a is formed in a curved shape in the cross-sectional view. This is advantageous for wide light distribution.

The surface of the light-transmissive member 40 has a recessed portion 40x (i.e., second recessed portion) recessed toward the light source 20 side in a region overlapping the encapsulant 30 in plan view. The recessed portion 40x preferably has a deepest portion located at a position at the center of the recessed portion 40x in plan view. Lateral surfaces of the recessed portion 40x are preferably axisymmetric in a cross section including a central axis that passes through the center of the recessed portion 40x. The recessed portion 40x defines, for example, a cone shape or a frustum shape. The recessed portion 40x has, for example, a rectangle shape in plan view. The recessed portion 40x defines, for example, a quadrangular pyramid shape or a truncated pyramid shape. The center of the recessed portion 40x preferably matches the optical axis of the light source 20 in plan view.

The recessed portion 40x controls an emission direction of light by using refraction of light at an interface between environments inside and outside the light-transmissive member 40. When the recessed portion 40x has inclined lateral surfaces as in the case of the cone shape or the frustum shape, light reflected by the interface between environments inside and outside the light-transmissive member 40 diffuses in a wider range in the light-transmissive member 40, and travels to the substrate 10 side. Thus, the light from the light source 20 can be more efficiently diffused into a surface of the light-transmissive member 40. In other words, because the recessed portion 40x is located above the light source 20, light emitted above the light source 20 can be diffused in a lower direction and the lateral direction while being moderately transmitted. As a result, it is possible to suppress brightness directly above the light source 20 from becoming much higher than that in other regions.

Method for Manufacturing Light Emitting Device 1

Figure 7:
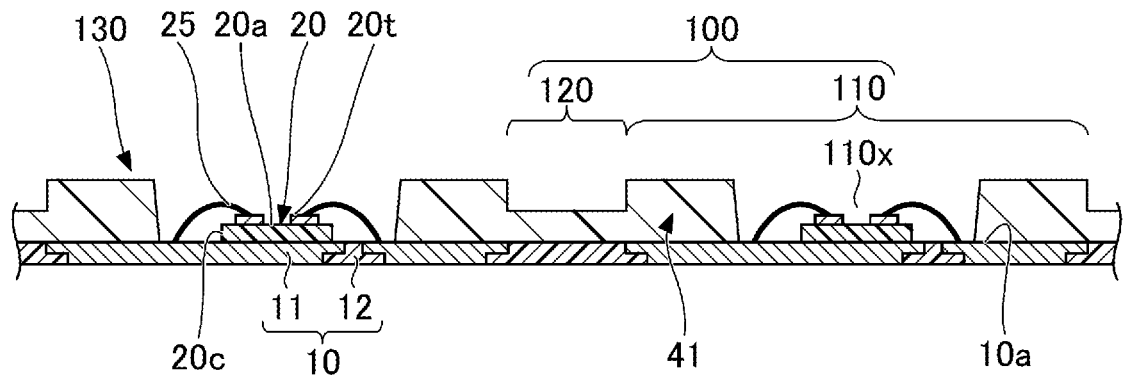
FIG. 7 is a schematic cross-sectional view (3) exemplifying a manufacturing step of the light emitting device according to the first embodiment.
Figure 8:
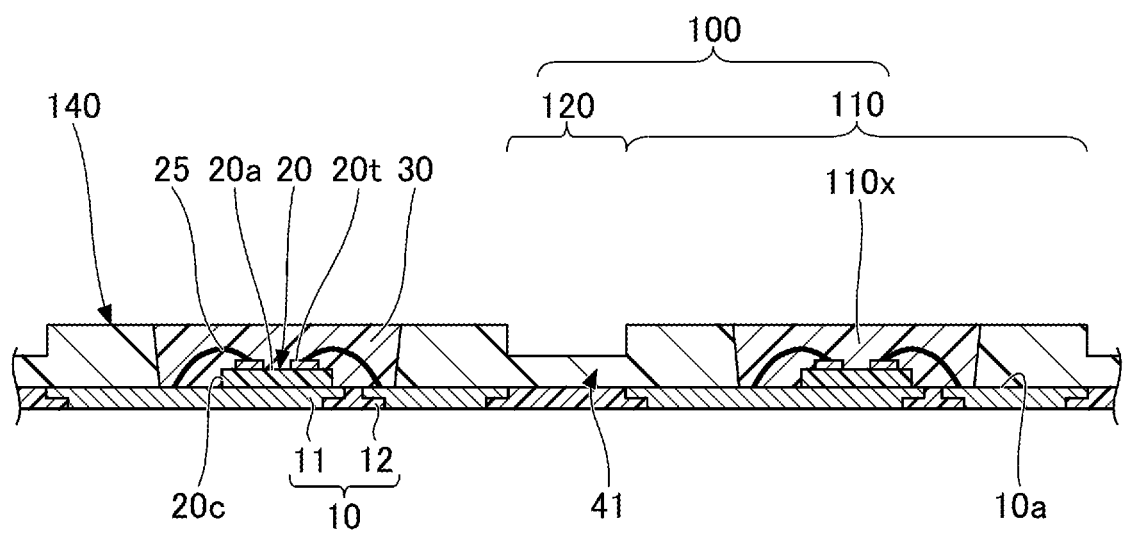
FIG. 8 is a schematic cross-sectional view (4) exemplifying a manufacturing step of the light emitting device according to the first embodiment.
Figure 9:
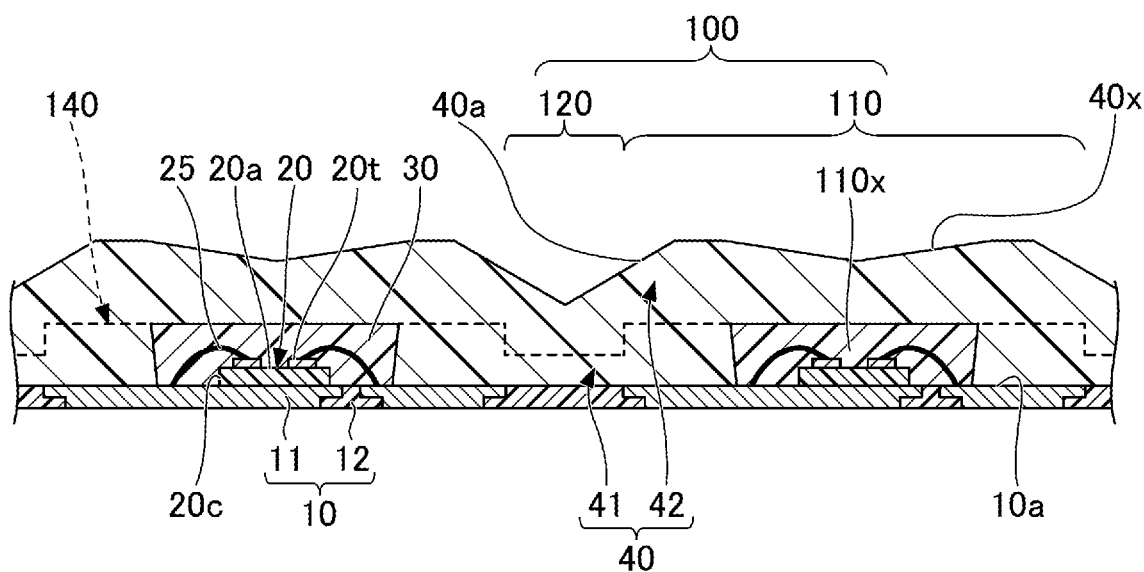
FIG. 9 is a schematic cross-sectional view (5) exemplifying a manufacturing step of the light emitting device according to the first embodiment.
Figure 10:
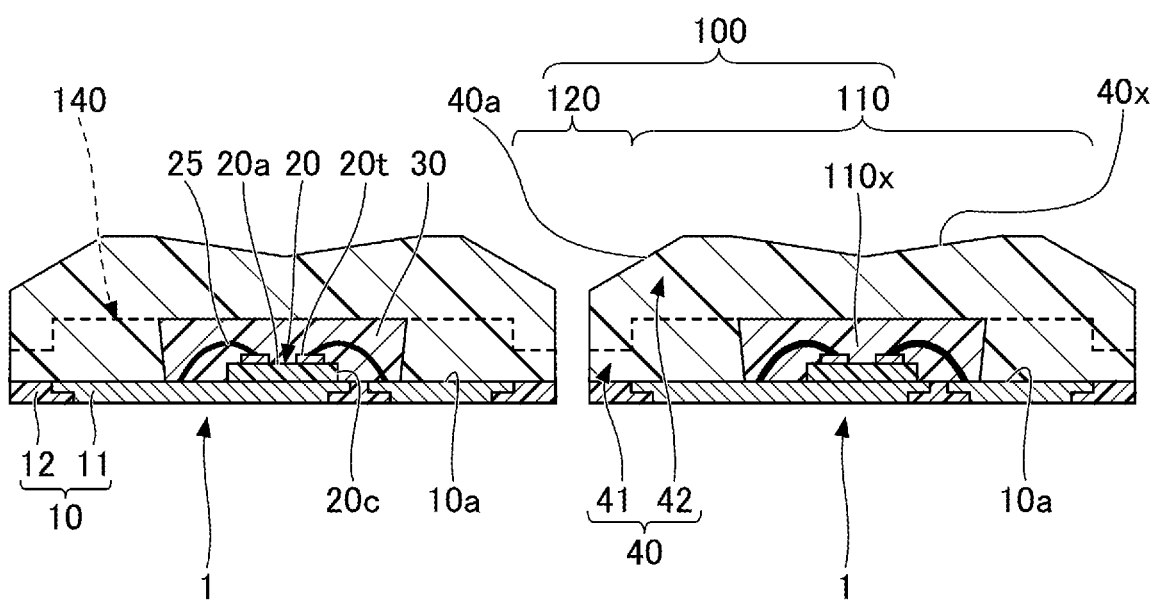
FIG. 10 is a schematic cross-sectional view (6) exemplifying a manufacturing step of the light emitting device according to the first embodiment.

FIGS. 3 to 10 are schematic views exemplifying manufacturing steps of the light emitting device according to the first embodiment. As illustrated in FIGS. 3 to 8, the manufacturing steps of the light emitting device 1 include a step of providing an intermediate member 140 including a support member 100, the light source 20, and the encapsulant 30. Further, as illustrated in FIG. 9, the manufacturing steps of the light emitting device 1 include a step of forming a first light-transmissive member 42 on the intermediate member 140. Further, as illustrated in FIG. 10, the manufacturing steps of the light emitting device 1 may include a step of cutting both of a second light-transmissive member 41 and the first light-transmissive member 42 after the step of forming the first light-transmissive member 42, and manufacturing a plurality of light emitting devices 1. Each step illustrated in FIGS. 3 to 10 will be described below in detail.

Figure 3:
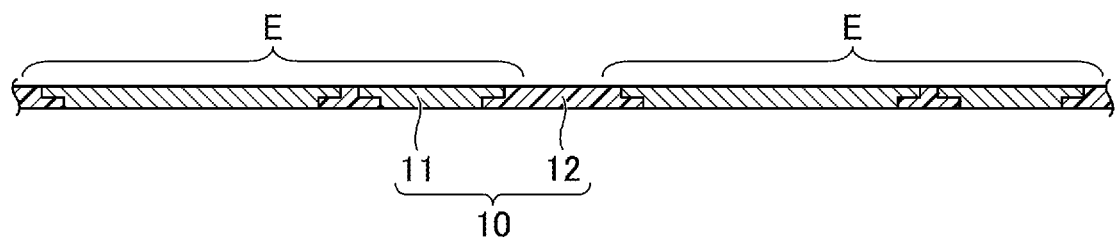
FIG. 3 is a schematic cross-sectional view (1) exemplifying a manufacturing step of the light emitting device according to the first embodiment.
Figure 4:
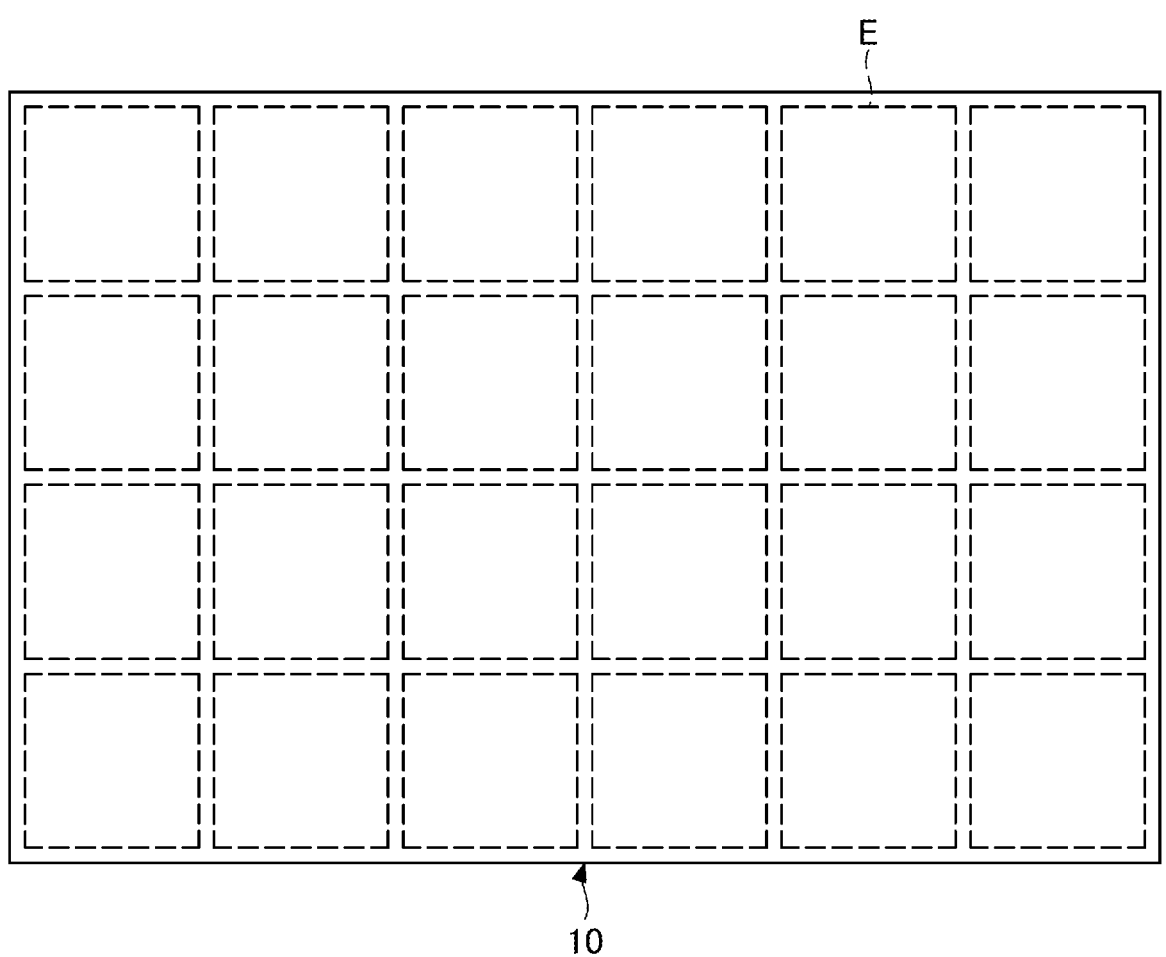
FIG. 4 is a schematic plan view (1) exemplifying a manufacturing step of the light emitting device according to the first embodiment.

FIGS. 3 to 6 illustrate steps of providing the support member 100. First, in order to provide the support member 100, as illustrated in the cross-sectional view of FIG. 3 and the plan view of FIG. 4, the substrate 10 including the pair of leads 11 and the insulating member 12 is provided. The substrate 10 can be manufactured by, for example, insert molding or the like. A plurality of regions E each corresponding to the light emitting device 1 are defined in the substrate 10. The plurality of regions E to each become the light emitting device 1 are two-dimensionally aligned in plan view in FIG. 4, but may be one-dimensionally aligned in plan view. Note that FIG. 3 illustrates a cross section including two adjacent regions E. Further, FIG. 4 illustrates only an arrangement of the regions E, and a detailed illustration of the substrate 10 in each of the regions E is omitted.

Figure 5:
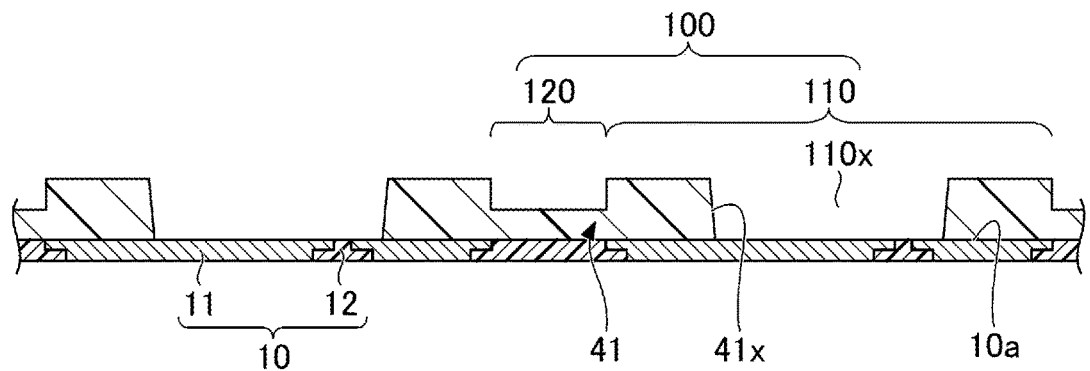
FIG. 5 is a schematic cross-sectional view (2) exemplifying a manufacturing step of the light emitting device according to the first embodiment.
Figure 6:
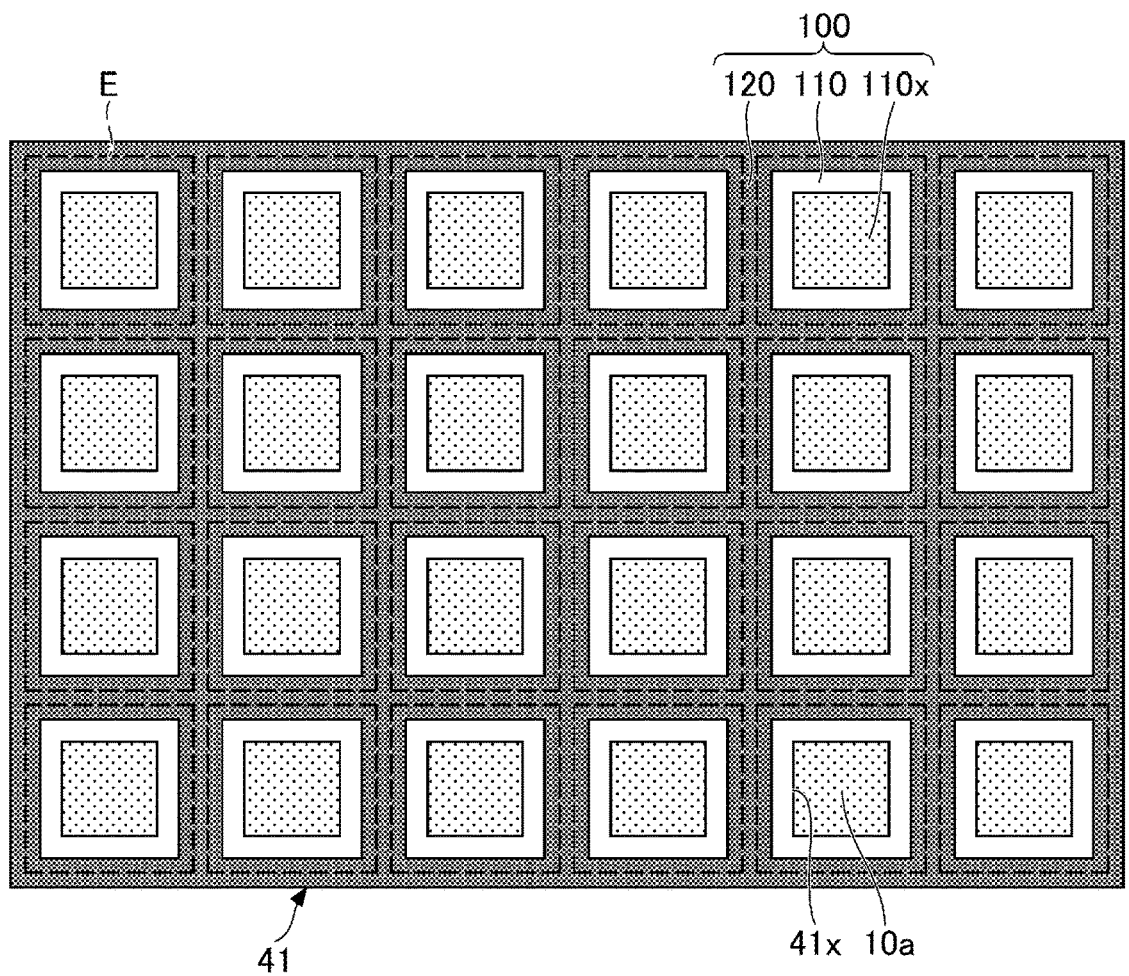
FIG. 6 is a schematic plan view (2) exemplifying a manufacturing step of the light emitting device according to the first embodiment.

Subsequently, as illustrated in the cross-sectional view of FIG. 5 and the plan view of FIG. 6, the second light-transmissive member 41 having a through hole 41x is disposed on the substrate 10. When the second light-transmissive member 41 is disposed on the substrate 10, a recessed portion 110x (i.e., first recessed portion) is defined by a lateral wall of the second light-transmissive member 41 defining the through hole 41x and the upper surface 10a of the substrate 10.

In this way, the support member 100 is formed, where the support member 100 includes a plurality of housing portions 110 and a coupling portion 120. Each housing portion 110 has the recessed portion 110x having a lateral wall and a bottom surface. The coupling portion 120 is located between adjacent housing portions 110. The housing portion 110 is a portion that can house a light source inward of the recessed portion 110x. The coupling portion 120 has a height lower than a height of the lateral wall of the recessed portion 110x with reference to the upper surface 10a of the substrate 10 forming the bottom surface of the recessed portion 110x. For example, in plan view, the recessed portion 110x has a rectangular shape, and the coupling portion 120 has a grid shape. For example, the coupling portion 120 is located so as to include an outer edge of each of the regions E, and one recessed portion 110x is located in each of the regions E.

The second light-transmissive member 41 is formed of a resin by, for example, transfer molding or compression molding. When the second light-transmissive member 41 is formed by transfer molding, first, an upper mold having a hollow portion in a shape corresponding to the shape of the second light-transmissive member 41 is disposed on the upper surface 10a side of the substrate 10. Further, a lower mold is disposed on the lower surface side of the substrate 10. Then, the uncured second light-transmissive member 41 is poured from an injection port into the hollow portion. When the second light-transmissive member 41 is formed by compression molding, first, the substrate 10 is disposed on the lower mold, the uncured second light-transmissive member 41 is disposed on the upper surface 10a of the substrate 10, the upper mold is then closed, and the uncured second light-transmissive member 41 is molded while being compressed.

The second light-transmissive member 41 may be cured in this step, or may be left in a semi-cured state in this step and be cured together with the first light-transmissive member 42 in a step described later. For example, the second light-transmissive member 41 may be heated at a temperature lower than a curing temperature of the second light-transmissive member 41 to achieve the semi-cured state of the second light-transmissive member 41. Note that the semi-cured state is a cured state to a degree of not deforming the second light-transmissive member 41.

The second light-transmissive member 41 is preferably formed by transfer molding. The substrate 10 may be provided with a hole for ease of cutting when forming individual pieces. However, by forming the second light-transmissive member 41 by transfer molding, the second light-transmissive member 41 fills the hole provided in the substrate 10, and a continuous surface without the hole can be formed. In this way, compression molding can be used when the first light-transmissive member 42 is formed. Note that, in a case in which the first light-transmissive member 42 is formed by compression molding, when a member located below the first light-transmissive member 42 has a hole, resin flows to an opposite surface side through the hole, which is not preferable.

Subsequently, as illustrated in the cross-sectional view of FIG. 7, the light source 20 is mounted on the bottom surface of each of the recessed portions 110x of the support member 100. Here, as an example, the light source 20 is a light emitting element including the upper surface 20a and the lateral surface 20c. For example, a planar shape of the light source 20 is a rectangular shape, and a planar shape of the recessed portion 110x is a rectangular shape larger than the light source 20. For example, in plan view, the light source 20 is disposed on the bottom surface of the recessed portion 110x such that each vertex of the rectangle shape of the recessed portion 110x is located on the extended line of the diagonal line of the rectangle shape of the light source 20.

Specifically, for example, the light source 20 is provided and bonded to the bottom surface of the recessed portion 110x with an adhesive material. Then, the pair of electrodes 20t of the light source 20 and the pair of leads 11 of the substrate 10 are electrically connected by the metal wires 25.

By the steps illustrated in FIGS. 3 to 7 described above, an intermediate member 130 including the support member 100 and the plurality of light sources 20 is provided.

Subsequently, as illustrated in the cross-sectional view of FIG. 8, the encapsulant 30 covering the light source 20 is disposed in each of the recessed portions 110x of the support member 100 to form the intermediate member 140. In other words, the intermediate member 140 is formed of the intermediate member 130 illustrated in FIG. 7 and the encapsulant 30 disposed in the recessed portions 110x. Specifically, an uncured resin to become the encapsulant 30 is prepared. Then, a filler, a diffusion agent, a pigment, a fluorescent material, a reflective material, and the like are added to the uncured resin as necessary and dispersed. Subsequently, the obtained uncured resin is disposed in each recessed portion 110x by using a dispenser and the like. It is preferable that the uncured resin completely covers the light source 20 located in the recessed portion 110x. Subsequently, the uncured resin is cured. For example, when the uncured resin is a thermosetting resin, the uncured resin can be cured by being held at a temperature equal to or higher than a curing temperature.

Note that when the uncured resin to become the encapsulant 30 contains particles of the phosphor, a step of disposing the encapsulant 30 may include a step of disposing the uncured resin containing the particles of the phosphor in the recessed portion 110x, and a step of settling the particles of the phosphor on the bottom surface side of the recessed portion 110x. For example, when a phosphor having a specific gravity greater than that of the uncured resin is selected, the phosphor can be settled before the uncured resin is cured. By settling the phosphor, the phosphor is locally positioned on the bottom surface side of the recessed portion 110x, and thus unevenness in color of the light emitting device 1 after formed into individual pieces can be effectively reduced.

Subsequently, as illustrated in FIG. 9, the first light-transmissive member 42 continuously covering each of the housing portions 110 and the coupling portions 120 is formed. In other words, the uncured first light-transmissive member 42 is disposed on the second light-transmissive member 41, the first light-transmissive member 42 is cured, and the light-transmissive member 40 formed of the second light-transmissive member 41 and the first light-transmissive member 42 integral together is formed. In the steps illustrated in FIGS. 5 and 6, when the second light-transmissive member 41 is left semi-cured, in the step illustrated in FIG. 9, the semi-cured second light-transmissive member 41 and the uncured first light-transmissive member 42 are cured together. The second light-transmissive member 41 and the first light-transmissive member 42 are preferably formed of the same material, for example, the same resin. The same resin in an uncured and/or semi-cured state to become the second light-transmissive member 41 and the first light-transmissive member 42 is cured together in this step, and thus an interface between the second light-transmissive member 41 and the first light-transmissive member 42 is substantially eliminated, and the occurrence of refraction of light at the interface can be prevented.

The first light-transmissive member 42 is formed by, for example, transfer molding or compression molding. When the first light-transmissive member 42 is formed by transfer molding, first, an upper mold having a hollow portion in a shape corresponding to the shape of the first light-transmissive member 42 is disposed on an upper surface side of the second light-transmissive member 41. In other words, when the shape of the first light-transmissive member 42 has a recessed portion and an inclined surface and is a rectangle in plan view, an upper mold having a hollow portion in a shape corresponding to the shape of the first light-transmissive member 42 is disposed. Alternatively, when the shape of the first light-transmissive member 42 is a shape other than a rectangle in plan view, an upper mold having a hollow portion in a shape corresponding to a shape other than a square (for example, an octagon) is disposed. Further, a lower mold is disposed on the lower surface side of the substrate 10. Then, the uncured first light-transmissive member 42 is poured from an injection port into the hollow portion and is cured. When the first light-transmissive member 42 is formed by compression molding, first, the intermediate member 140 is disposed on the lower mold, the uncured first light-transmissive member 42 is filled onto the second light-transmissive member 41 of the intermediate member 140, the upper mold is then closed, and the uncured first light-transmissive member 42 is cured while being compressed.

A surface of the light-transmissive member 40 has a structure including the inclined surface 40a having a height above the coupling portion 120 lower than a height above the housing portion 110 with reference to the upper surface 10a of the substrate 10 forming the bottom surface of the recessed portion 110x. For example, the inclined surface 40a is formed linearly in the cross-sectional view. In the light-transmissive member 40, the recessed portion 40x recessed to the light source 20 side is preferably formed in a region overlapping the recessed portion 110x in plan view. The recessed portion 40x is formed in a cone shape or a frustum shape, for example.

In this step, the first light-transmissive member 42 continuously covering the housing portion 110 and the coupling portion 120 is formed, but the coupling portion 120 has a height lower than a height of the lateral wall of the recessed portion 110x. Thus, adhesion between the second light-transmissive member 41 and the first light-transmissive member 42 can be improved by an anchor effect due to a protrusion and a recession formed of the lateral wall of the recessed portion 110x and the coupling portion 120.

Subsequently, as illustrated in FIG. 10, the coupling portion 120 and a portion of the first light-transmissive member 42 covering the coupling portion 120 are cut to obtain individual pieces being the plurality of light emitting devices 1. For example, when the coupling portion 120 has a grid shape as illustrated in FIG. 6, the coupling portion 120 and the first light-transmissive member 42 are cut in the grid shape along the coupling portion 120. In other words, both of the second light-transmissive member 41 and the first light-transmissive member 42 are cut to produce the plurality of light emitting devices 1. For example, a rotation blade having a disk shape, an ultrasonic cutter, laser light irradiation, or the like can be used as a method for cutting.

Note that, when the coupling portion 120 and the first light-transmissive member 42 are cut, at least a part of the coupling portion 120 in a width direction may be cut in the grid shape along the coupling portion 120. In other words, when a portion corresponding to an interval between the adjacent housing portions 110 is set as a width of the coupling portion 120, the entire coupling portion 120 in the width direction may be cut, or a part of the coupling portion 120 in the width direction may be cut in the cross section illustrated in FIG. 10. When at least a part of the coupling portion 120 in the width direction is cut in the grid shape along the coupling portion 120, for example, the light emitting device 1 obtained as an individual piece includes a remaining portion of the coupling portion 120 around the housing portion 110 in plan view.

In this way, in the method for manufacturing the light emitting device 1, the support member 100 is provided, where the support member 100 includes the housing portion 110 having the recessed portion 110x with the lateral wall and the bottom surface, and the coupling portion 120 located between the adjacent housing portions 110. Then, the encapsulant 30 covering the light source 20 is disposed in the recessed portions 110x of the support member 100. In this way, the shape of the encapsulant 30 can be defined by the shape of the recessed portion 110x, and thus encapsulants 30 having little shape variation can be easily formed.

Further, in the support member 100, the coupling portion 120 is formed so as to have a height lower than a height of the lateral wall of the recessed portion 110x with reference to the bottom surface of the recessed portion 110x. Then, the first light-transmissive member 42 continuously covering the housing portion 110 and the coupling portion 120 that is lower than the lateral wall of the recessed portion 110x is formed. Thus, a surface of the first light-transmissive member 42 can be formed in a structure having the inclined surface 40a whose height above the coupling portion 120 is lower than a height above the housing portion 110 with reference to the bottom surface of the recessed portion 110x. In this way, the inclined surface 40a can be provided while reducing the thickness of the light emitting device 1. In other words, in the light-transmissive member 40, light from the light source 20 is refracted at the inclined surface 40a and travels in the lateral direction, and thus wide light distribution can be achieved while reducing the thickness of the light emitting device 1.

Particularly, in the step of forming the first light-transmissive member 42, a portion of the inclined surface 40a at the lowest height from the bottom surface of the recessed portion 110x is formed lower than a height of the lateral wall of the housing portion 110, and thus the light emitting device 1 can be further reduced in thickness.

Planar Light Source

The light emitting device 1 can be used alone, or a plurality of the light emitting devices 1 can be arranged to be used as a planar light source. Here, an example of the planar light source using the light emitting device 1 will be described.

Figure 11:
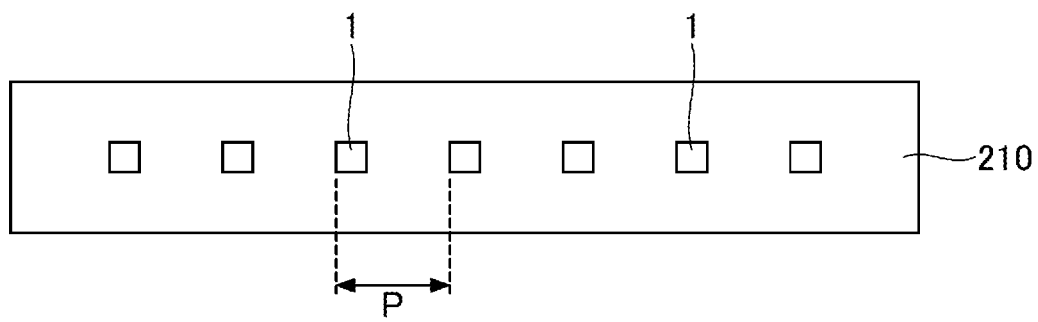
FIG. 11 is a schematic plan view (1) exemplifying a planar light source comprising a light emitting device 1.
Figure 12:
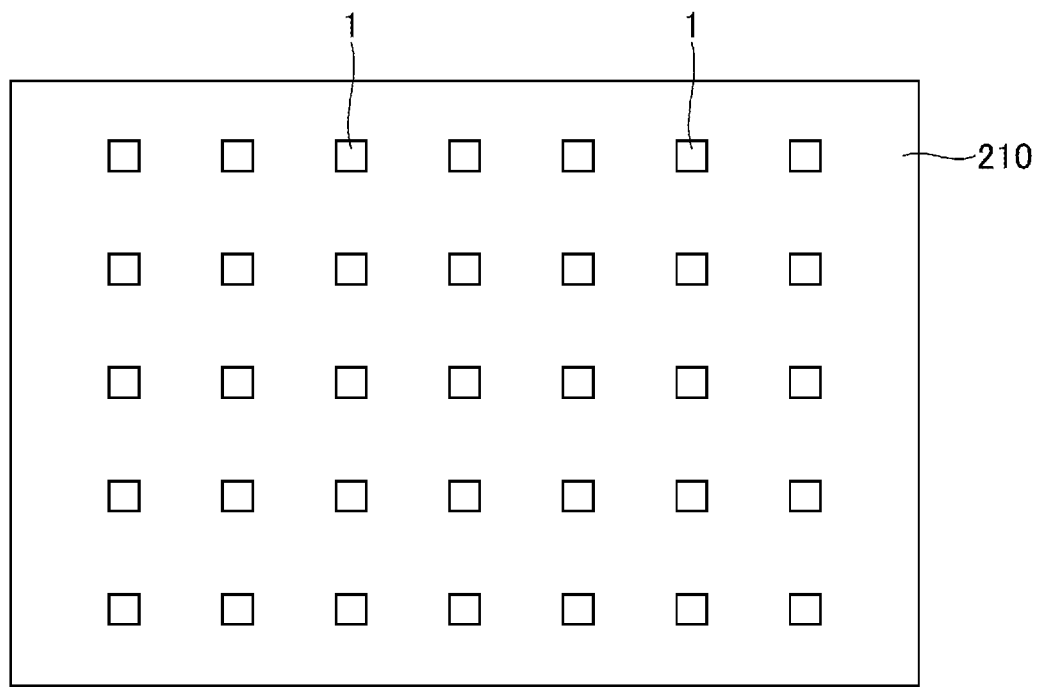
FIG. 12 is a schematic plan view (2) exemplifying a planar light source comprising the light emitting device 1.

FIG. 11 is a schematic plan view (1) exemplifying the planar light source using the light emitting device 1. FIG. 12 is a schematic plan view (2) exemplifying the planar light source using the light emitting device 1. A planar light source 200 illustrated in FIG. 11 includes the plurality of light emitting devices 1 aligned in a row on a wiring substrate 210. A planar light source 200A illustrated in FIG. 12 includes the plurality of light emitting devices 1 arranged in a matrix on the wiring substrate 210.

In the planar light sources 200 and 200A, pitches (P in FIG. 11) of the plurality of light emitting devices 1 are preferably the same, but may be different. The pitch of the light emitting devices 1 can be appropriately adjusted depending on the size, brightness, and the like of the light emitting device. The pitch of the light emitting devices 1 is, for example, in a range from 5 mm to 100 mm, and is preferably in a range from 8 mm to 50 mm.

Figure 13:
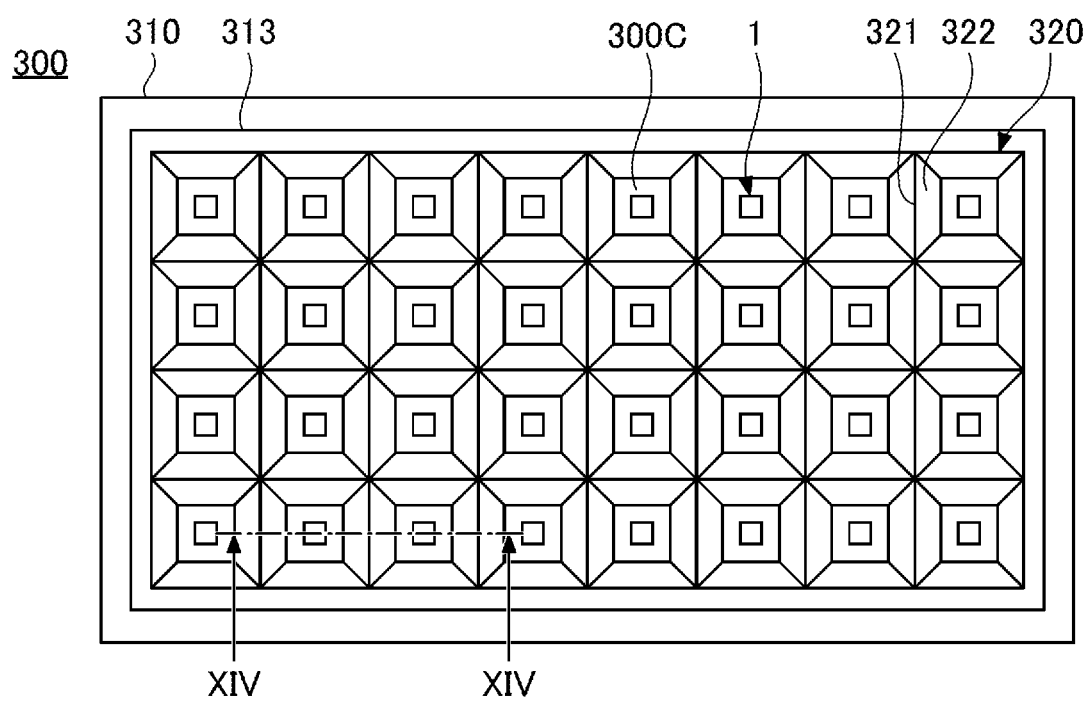
FIG. 13 is a schematic plan view illustrating a specific example of a planar light source comprising the light emitting device 1.
Figure 14:
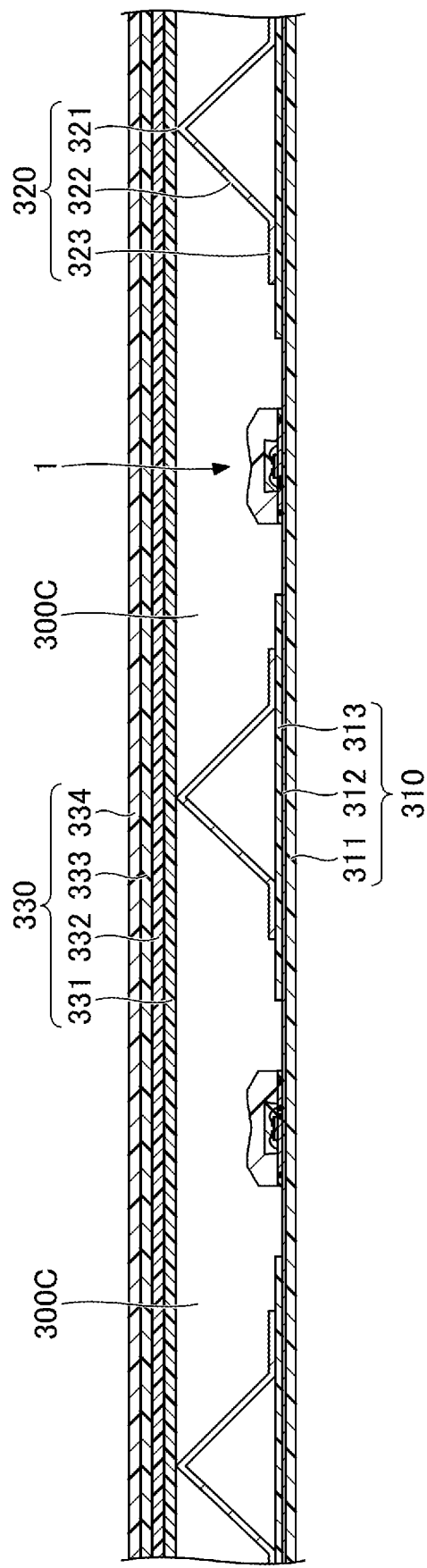
FIG. 14 is a schematic partial cross-sectional view taken along line XIV-XIV in FIG. 13 illustrating a specific example of the planar light source comprising the light emitting device 1.

A specific example of the planar light source is described below with reference to FIGS. 13 and 14. FIG. 13 is a schematic plan view illustrating a specific example of the planar light source using the light emitting device 1. FIG. 14 is a schematic partial cross-sectional view taken along line XIV-XIV in FIG. 13 illustrating a specific example of the planar light source using the light emitting device 1. Note that, FIG. 13 illustrates members below a partition member 320 illustrated in FIG. 14.

A planar light source 300 illustrated in FIGS. 13 and 14 includes the light emitting devices 1, a wiring substrate 310, and the partition members 320. The wiring substrate 310 includes an insulating base material 311 and a wire 312 provided on the base material 311, and may include an insulating resin 313 covering a part of the wire 312 as necessary. The insulating resin 313 preferably has light reflectivity.

The partition member 320 is disposed on the same side as the light emitting device 1 of the wiring substrate 310. The partition member 320 includes a top portion 321 located in a grid shape in plan view, a wall portion 322 surrounding each of the light emitting devices 1 in plan view, and a bottom portion 323 connected to a lower end of the wall portion 322, and has a plurality of regions each surrounding the light emitting device 1. The wall portion 322 of the partition member 320 extends from the top portion 321 to the wiring substrate 310 side, for example, and a width of a region surrounded by opposing wall portions 322 becomes narrower as becoming closer to the wiring substrate 310 side in the cross-sectional view. The light emitting device 1 is disposed in a through hole provided substantially at the center of the bottom portion 323. The partition member 320 is preferably a member having light reflectivity.

A range (that is, a region and space) surrounded by the wall portions 322 is defined as one partition 300C, and the partition member 320 includes a plurality of the partitions 300C. For example, one light emitting device 1 is disposed in one partition 300C.

In this way, the partition member 320 including the bottom portion 323 and the wall portion 322 surrounding each of the light emitting devices 1 is disposed on the wiring substrate 310, and thus light from the light emitting device 1 can be reflected by the wall portion 322 and the bottom portion 323, and extraction efficiency of light can be improved. Further, unevenness in brightness in each partition 300C and, furthermore, unevenness in brightness in group units of the partitions 300C can be suppressed.

The partition 300C has, for example, a rectangle shape in plan view. The partition member 320 is, for example, a reflector including the plurality of partitions 300C that have a rectangle shape in plan view. A distance from the center of the light emitting device 1 to four corners of the partition 300C is longer than a distance to another portion, and thus the four corners of the partition 300C tend to be dark. When the four corners are dark in each of the partitions 300C, unevenness in brightness will occur in the planar light source 300. However, because the light-transmissive member 40 has a square shape in plan view in the light emitting device 1, directivity in the diagonal line direction of the square is improved, and the intensity of light in the diagonal line direction is set higher than the intensity of light in the direction perpendicular to the center of each side of the square and the like. Thus, darkness at the four corners of the partition 300C can be suppressed in the planar light source 300, and unevenness in brightness can be reduced. Furthermore, when the encapsulant 30 contains a phosphor, unevenness in brightness and color in each of the partitions 300C can be suppressed and, furthermore, unevenness in brightness and color in the group units of the partitions 300C can be suppressed.

The planar light source 300 may include an optical member 330 on or above the top portion 321 of the partition member 320. The optical member 330 can include at least one kind selected from a group consisting of a light diffusion plate 331, a prism sheet (a first prism sheet 332 and a second prism sheet 333), and a polarizing sheet 334. When the planar light source 300 includes the optical member 330, uniformity of light can be improved.

In the planar light source 300, the optical member 330 is disposed on or above the top portion 321 of the partition member 320, and furthermore, a liquid crystal panel is disposed on the optical member 330, and the planar light source 300 can be used as a light source for direct backlight. The order of layering each member in the optical member 330 can be set as desired. Note that the optical member 330 may not be in contact with the top portion 321 of the partition member 320.

Light Diffusion Plate 331

The light diffusion plate 331 is disposed in contact with the top portion 321 of the partition member 320 above the light emitting device 1. The light diffusion plate 331 preferably has a flat plate-like shape, but may has protrusion(s) and depression(s) on a surface of the light diffusion plate 331. The light diffusion plate 331 is preferably disposed substantially parallel to the wiring substrate 310.

The light diffusion plate 331 can be formed of a material having low light absorption for visible light, such as a polycarbonate resin, a polystyrene resin, an acrylic resin, and a polyethylene resin. In order to diffuse incident light, the light diffusion plate 331 may be provided with protrusion(s) and depression(s) on the surface thereof, and a material having a different refractive index may be dispersed in the light diffusion plate 331. The size of the protrusion(s) and the depression(s) can be, for example, in a range from 0.01 mm to 0.1 mm. As the material having the different refractive index, for example, a polycarbonate resin, an acrylic resin, or the like can be used.

A thickness of the light diffusion plate 331 and a degree of light diffusion can be set as appropriate, and a commercially available member such as a light diffusion sheet or a diffuser film can be used. For example, the thickness of the light diffusion plate 331 can be in a range from 1 mm to 2 mm.

First Prism Sheet 332 and Second Prism Sheet 333

The first prism sheet 332 and the second prism sheet 333 have a shape in which a plurality of prisms extending in a predetermined direction are arranged on a surface thereof.

For example, when a plane of the sheet is viewed two-dimensionally in an X direction and a Y direction perpendicular to the X direction, the first prism sheet 332 can include a plurality of prisms extending in the Y direction, and the second prism sheet 333 can include a plurality of prisms extending in the X direction. The first prism sheet 332 and the second prism sheet 333 can refract light incident from various directions toward a display panel facing the planar light source 300. In this way, the light emitted from a light emitting surface of the planar light source 300 can be emitted mainly in a direction perpendicular to an upper surface, and brightness when the planar light source 300 is viewed from the top can be increased.

Polarizing Sheet 334

For example, the polarizing sheet 334 can selectively transmit light in a polarization direction that matches the polarization direction of a polarizing plate disposed on a backlight side of the display panel such as a liquid crystal display panel, and can reflect polarized light, which is polarized in a direction perpendicular to the polarization direction, toward the first prism sheet 332 and the second prism sheet 333 side. A part of the polarized light returned from the polarizing sheet 334 is reflected again by the first prism sheet 332, the second prism sheet 333, and the light diffusion plate 331. At this time, the reflected light changes in the polarization direction, and is, for example, converted into polarized light having the polarization direction of the polarizing plate of the liquid crystal display panel, is again incident on the polarizing sheet 334, and is emitted to the display panel. In this way, the polarization direction of the light emitted from the planar light source 300 can be aligned, and light in the polarization direction effective for improving the brightness of the display panel can be emitted with high efficiency. As the polarizing sheet 334, the first prism sheet 332, the second prism sheet 333, and the like, a commercially available optical member for backlight can be used.

The planar light source 300 can be manufactured by, for example, disposing the partition member 320 and the light emitting device 1 on the wiring substrate 310 and disposing the optical member 330 on or above the partition member 320 as necessary.

First Modification Example of First Embodiment

Figure 15:
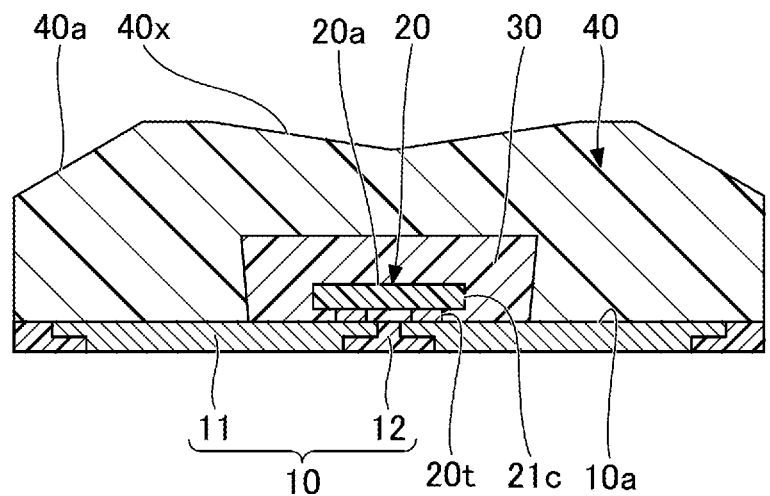
FIG. 15 is a schematic cross-sectional view (1) exemplifying a light emitting device according to a first modification example of the first embodiment.

In a first modification example of the first embodiment, an example of a light emitting device having a different structure in the vicinity of the light source will be described. FIG. 15 is a schematic cross-sectional view (1) exemplifying a light emitting device according to the first modification example of the first embodiment. As illustrated in FIG. 15, in a light emitting device 1A, the light source 20 is mounted on the upper surface 10a of the substrate 10 with the electrode 20t facing the substrate 10 side. For example, the pair of electrodes 20t of the light source 20 are electrically connected to the pair of leads 11 of the substrate 10 through a conductive joint member.

In order to mount the light source 20 on the substrate 10, for example, in the step in FIG. 7 according to the first embodiment, the light source 20 is disposed on the substrate 10 with the electrodes 20t facing the bottom surface of the recessed portion 110x, and the pair of electrodes 20t and the pair of leads 11 of the substrate 10 are electrically connected by the conductive joint member. Examples of the conductive joint member include conductive paste such as silver, gold, and palladium, a eutectic solder material such as gold-tin and tin-silver-copper, a brazing material such as metal having a low melting point, and a bump including silver, gold, or the like.

The light source 20 may be mounted on the substrate 10 with the electrode 20t facing an opposite side to the substrate 10 as illustrated in FIG. 2, or the light source 20 may be mounted on the substrate 10 with the electrode 20t facing the substrate 10 side as illustrated in FIG. 15.

Figure 16:
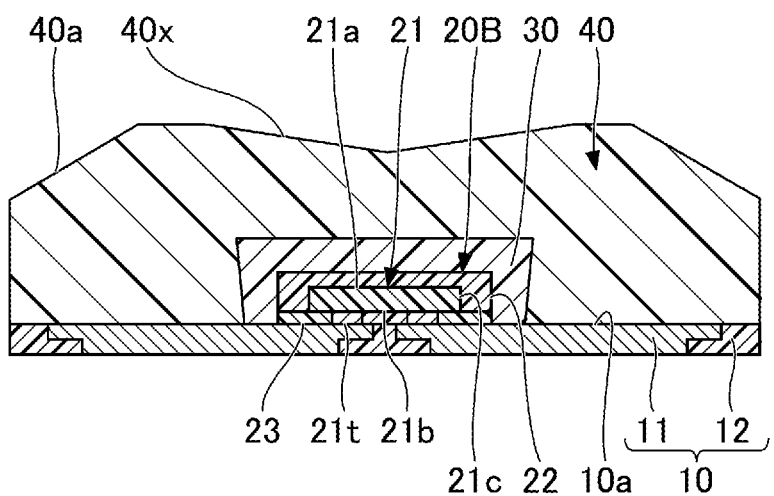
FIG. 16 is a schematic cross-sectional view (2) exemplifying a light emitting device according to the first modification example of the first embodiment.
Figure 17:
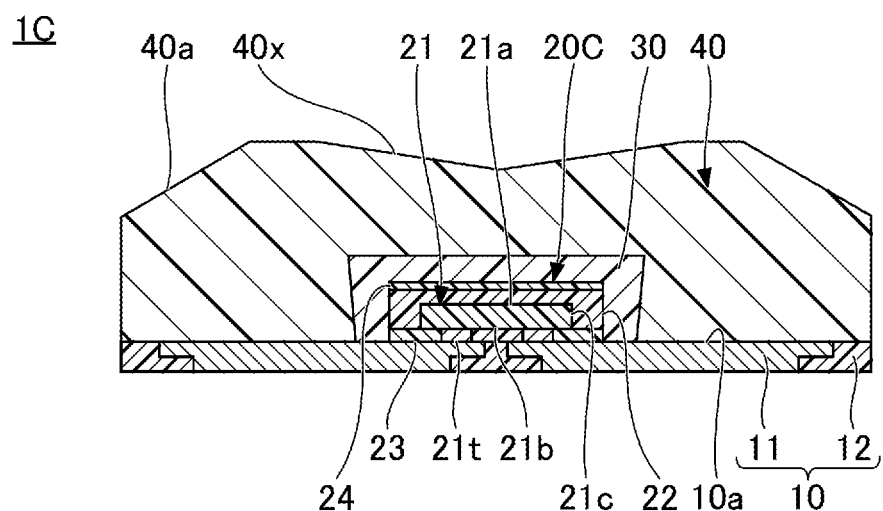
FIG. 17 is a schematic cross-sectional view (3) exemplifying a light emitting device according to the first modification example of the first embodiment.
Figure 18:
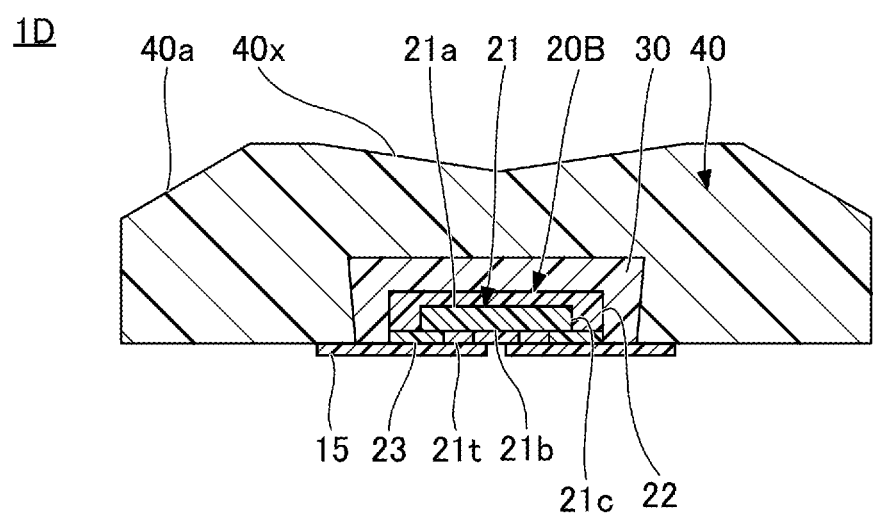
FIG. 18 is a schematic cross-sectional view (4) exemplifying a light emitting device according to the first modification example of the first embodiment.

Further, as illustrated in FIGS. 16 to 18, a light source may have a structure in which an optical member such as a light-transmissive member or a light adjustment member is combined with a light emitting element, instead of being a light emitting element alone. A detailed description will be given below.

FIG. 16 is a schematic cross-sectional view (2) exemplifying a light emitting device according to the first modification example of the first embodiment. In a light emitting device 1B illustrated in FIG. 16, a light source 20B includes a light emitting element 21, a light-transmissive member 22, and a covering member 23.

The light emitting element 21 has an upper surface 21a, a lower surface 21b, and at least a lateral surface 21c. The light emitting element 21 is, for example, an LED. Details of the light emitting element are as described in the first embodiment. The light emitting element 21 includes a pair of electrodes 21t formed on the lower surface 21b. One of the pair of electrodes 21t is a p-side electrode, and the other is an n-side electrode.

The light source 20 is mounted on the upper surface 10a of the substrate 10 with the electrodes 21t of the light emitting element 21 facing the substrate 10 side. For example, the pair of electrodes 21t of the light emitting element 21 are electrically connected to the pair of leads 11 of the substrate 10 through a conductive joint member. Note that, in FIG. 16, the pair of electrodes 21t (that is, the p-side electrode and the n-side electrode) of the light emitting element 21 are used as electrodes of the light source 20B with no modification, but an external connection electrode connected to each of the p-side electrode and the n-side electrode of the light emitting element 21 may be used as an electrode of the light source 20B.

The light-transmissive member 22 covers the upper surface 21a and the lateral surface 21c of the light emitting element 21. A lower surface of the light-transmissive member 22 is, for example, in the same plane as the lower surface 21b of the light emitting element 21. The light-transmissive member 22 may include a light diffusion material and a wavelength conversion member. When the wavelength conversion member is used, a type of wavelength conversion member different from that of the phosphor provided in the encapsulant 30 is preferably used.

The covering member 23 covers the lower surface 21b of the light emitting element 21, a lateral surface of the electrode 21t, and the lower surface of the light-transmissive member 22, and exposes a lower surface of the electrode 21t. A lower surface of the light source 20B is formed of a lower surface of the covering member 23 and the lower surface of the electrode 21t. The covering member 23 is preferably a member that reflects light. Note that the covering member 23 may not be provided.

In order to mount the light source 20B on the substrate 10, for example, in the step in FIG. 7 according to the first embodiment, the light source 20B is disposed on the substrate 10 with the electrodes 21t of the light emitting element 21 facing the bottom surface of the recessed portion 110x, and the pair of electrodes 21*t* and the pair of leads 11 of the substrate 10 are electrically connected by the conductive joint member.

FIG. 17 is a schematic cross-sectional view (3) exemplifying a light emitting device according to the first modification example of the first embodiment. In a light emitting device 1C illustrated in FIG. 17, a light source 20C includes the light emitting element 21, the light-transmissive member 22, the covering member 23, and a light adjustment member 24. The light adjustment member 24 covers the upper surface of the light-transmissive member 22. The light adjustment member 24 preferably covers the entire upper surface of the light-transmissive member 22. The light adjustment member 24 reflects a portion of the light emitted from the light emitting element 21, and transmits the other portion of the light emitted from the light emitting element 21. The light source 20C can be mounted on the substrate 10 by a method similar to that used for the light source 20B, for example.

FIG. 18 is a schematic cross-sectional view (4) exemplifying a light emitting device according to the first modification example of the first embodiment. A light emitting device 1D illustrated in FIG. 18 does not include the substrate 10. The pair of electrodes 21*t* of the light emitting element 21 are exposed on a lower surface side of the encapsulant 30, and each of the electrodes 21*t* is electrically connected to an external connection electrode 15. The external connection electrode 15 has a larger area than that of the electrode 21*t* when viewed from a lower surface side of the light emitting device 1D.

In order to manufacture the light emitting device 1D, for example, in the step in FIG. 7 according to the first embodiment, the light source 20B is disposed on the substrate 10 with the electrodes 21*t* of the light emitting element 21 facing the bottom surface of the recessed portion 110*x*. Then, the substrate 10 is removed before or after the step illustrated in FIG. 10 according to the first embodiment. Subsequently, a pair of the external connection electrodes 15 respectively electrically connected to the electrodes 21*t* of the light emitting element 21 are formed on the lower surface side of the encapsulant 30 by a sputtering method, a plating method, or the like. In this case, a support plate formed of metal, resin, or the like may be used as the substrate 10.

SECOND EMBODIMENT

A second embodiment will be described with reference to FIGS. 19 to 23.

Figure 19:
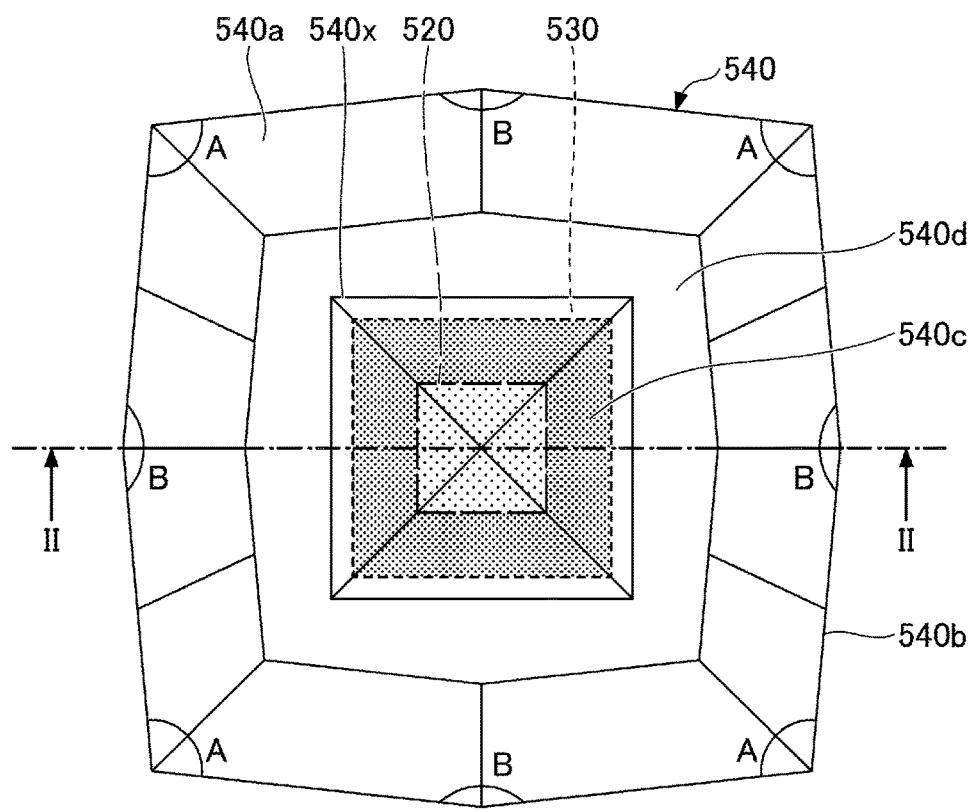
FIG. 19 is a schematic plan view exemplifying a light emitting device according to a second embodiment of the present disclosure.
Figure 20:
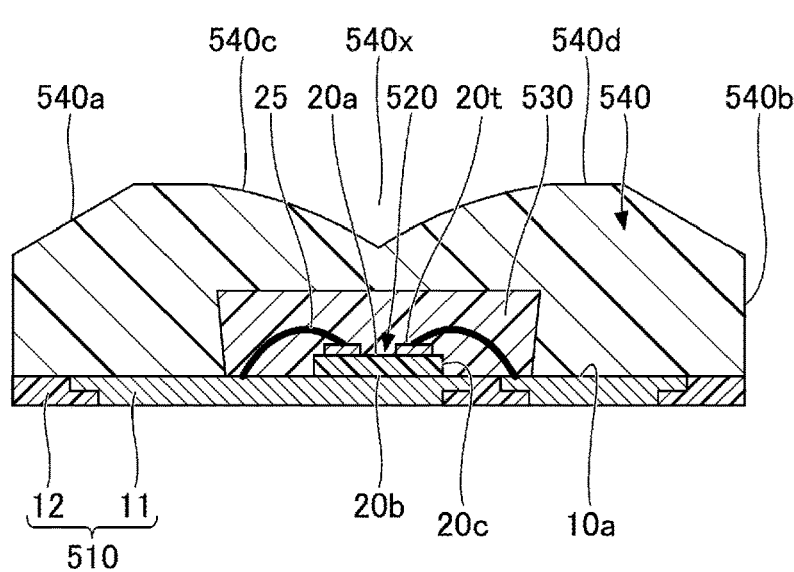
FIG. 20 is a schematic cross-sectional view taken along line II-II in FIG. 19 exemplifying the light emitting device according to the second embodiment.

FIG. 19 is a schematic plan view exemplifying a light emitting device 2 according to the second embodiment. FIG. 20 is a schematic cross-sectional view taken along line II-II in FIG. 19 exemplifying the light emitting device 2 according to the second embodiment.

As illustrated in FIGS. 19 and 20, the light emitting device 2 includes a substrate 510, a light source 520, an encapsulant 530, and a light-transmissive member 540. Note that, the substrate 510 is a member provided as necessary and is not an essential component of the light emitting device 2.

The light emitting device 2 according to the second embodiment is different in that the light-transmissive member 40 according to the first embodiment has a rectangle shape in plan view, whereas the light-transmissive member 540 according to the second embodiment has an octagon shape in plan view. The second embodiment will be described below, but the description of the first embodiment can be applied to the same points as the first embodiment, and thus a description may be omitted.

The light-transmissive member 540 has an octagon shape in plan view. All interior angles of the octagon are less than 180 degrees, and the interior angles have different angles. For example, four interior angles indicated by A in FIG. 19 may be the same angle, and four interior angles indicated by B may be the same angle. An angle of the four interior angles indicated by B may be greater than an angle of the four interior angles indicated by A. In this way, light emitted from the light emitting device 2 in the lateral direction can be adjusted such that intensity of the light in a direction in which intensity of the light is high can be reduced, and intensity of the light in a direction in which intensity of the light is low can be increased. Thus, the light emitting device 2 having unevenness in brightness reduced can be obtained.

Figure 21:
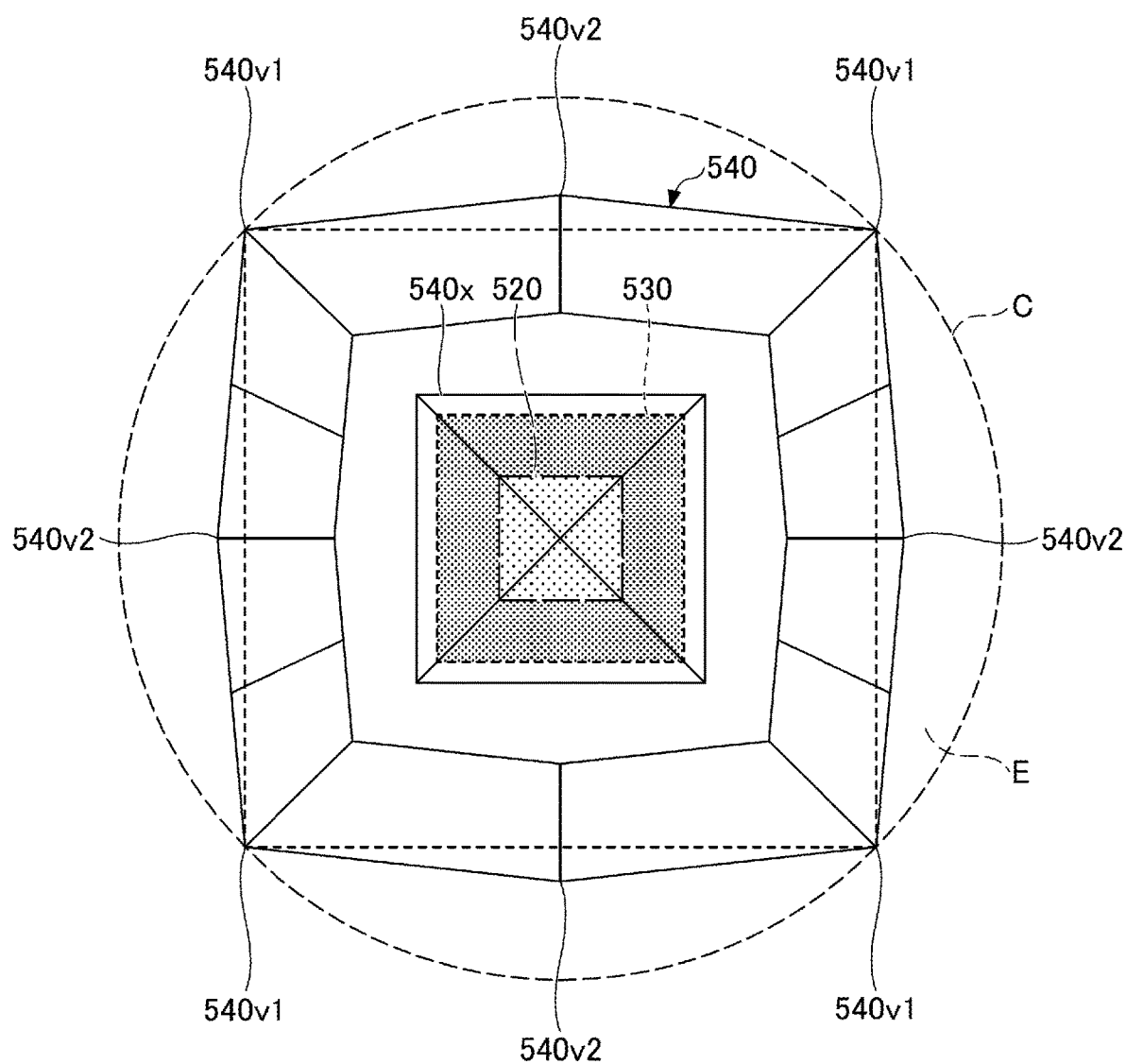
FIG. 21 is a schematic plan view (1) for describing the light emitting device according to the second embodiment.

In the light-transmissive member 540, the sides of the octagon may have equal lengths. In the light-transmissive member 540, the octagon shape may be four-fold symmetrical. In the light-transmissive member 540, as illustrated in FIG. 21, the octagon shape may include four first vertices 540*v*1 inscribed in a circle C, and other four second vertices 540*v*2 located in a region E surrounded by a chord and an arc determined by the circumferentially adjacent first vertices 540*v*1.

Figure 22:
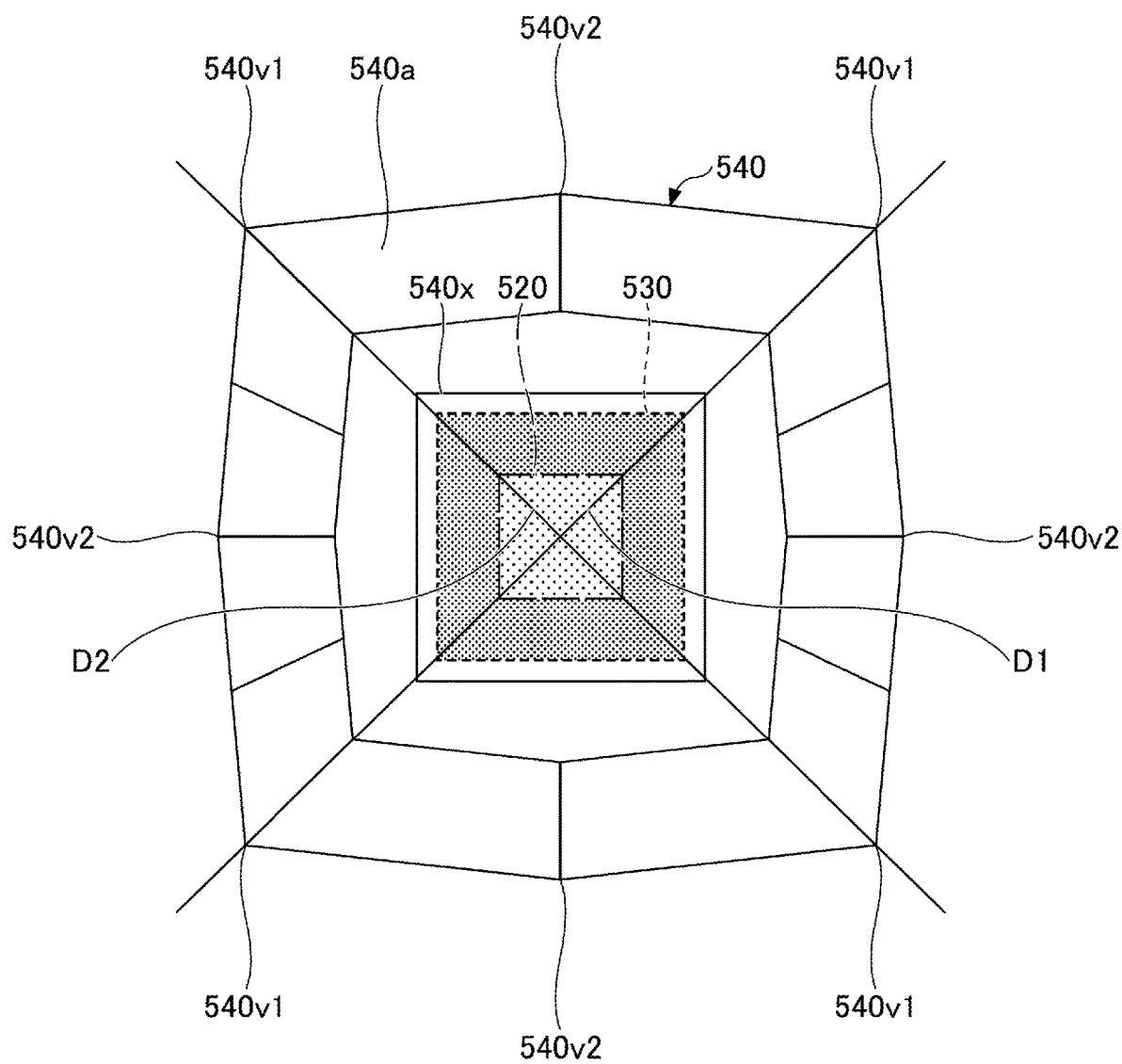
FIG. 22 is a schematic plan view (2) for describing the light emitting device according to the second embodiment.

The center of the light-transmissive member 540 preferably matches an optical axis of the light source 520 in plan view. When the encapsulant 530 has a rectangle shape in plan view and the light source 520 has a rectangle shape smaller than the encapsulant 530 in plan view, as illustrated in FIG. 22, each vertex of the rectangle shape of the encapsulant 530 is preferably located on an extended line of a diagonal line D1 or D2 of the rectangle of the light source 520. Further, as illustrated in FIG. 22, the four first vertices 540*v*1 are preferably located on the extended line of the diagonal line D1 or D2 of the rectangle of the light source 520 in plan view.

Figure 23:
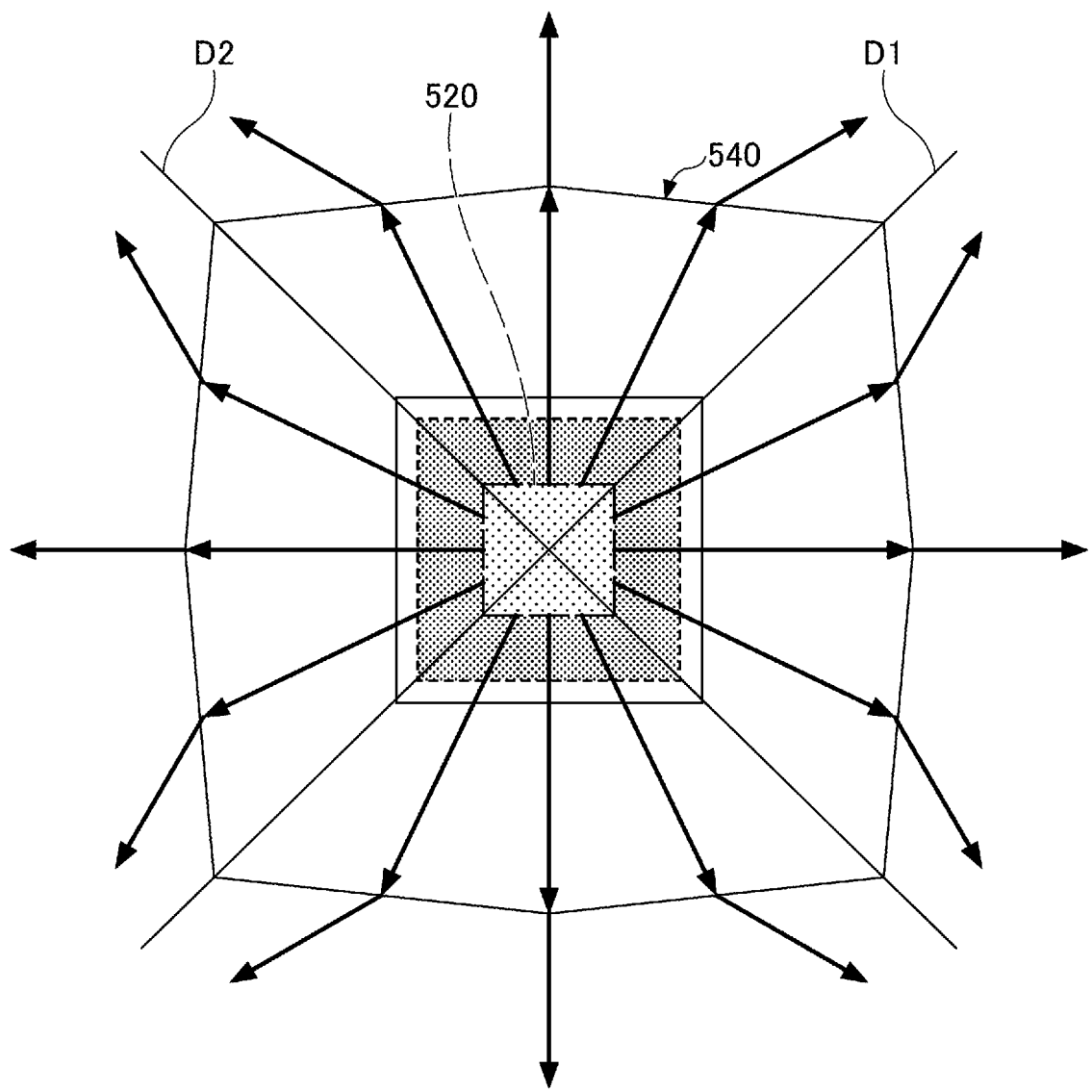
FIG. 23 is a plan view schematically illustrating a direction of light from a light source using an arrow.

FIG. 23 is a plan view schematically illustrating a direction of light from a light source using an arrow. When the light-transmissive member 540 has an octagon shape in plan view, as illustrated in FIG. 23, most of the light that is emitted from the light source 520 and passes through each side constituting the octagon of the light-transmissive member 540 is refracted in the direction of the diagonal line D1 or D2 in plan view. As a result, directivity in the directions of the diagonal lines D1 and D2 can be improved, and the intensity of light in directions of the four first vertices 540*v*1 illustrated in FIG. 22 can be set higher than the intensity of light in directions of the four second vertices 540*v*2.

In other words, for example, when the light-transmissive member 540 has a circular shape in plan view, directivity in each direction is uniform, but when the light-transmissive member 540 has an octagon shape in plan view, directivity in the directions of the diagonal lines D1 and D2 can be increased.

Returning to the description of FIGS. 19 and 20, the surface of the light-transmissive member 540 preferably has an inclined surface 540*a* having a height on a peripheral end side lower than a height on a center side with reference to a lower surface 20*b* of the light source 520. The inclined surface 540*a* is provided in, for example, an annular shape outside the encapsulant 530 in plan view. For example, in plan view, an outermost periphery of the inclined surface 540*a* is an octagon shape, and an innermost periphery is an octagon shape similar to the outermost periphery.

In the light-transmissive member 540, light from the light source 520 is refracted at the inclined surface 540*a*, and is emitted in the lateral direction. Thus, wide light distribution such as batwing light distribution can be achieved. The inclined surface 540a may be formed in a curved shape in the cross-sectional view, may be formed linearly in the cross-sectional view, and is preferably formed linearly in the cross-sectional view. When the inclined surface 540a is formed linearly in the cross-sectional view, light emitted in the lateral direction can be increased further than that when the inclined surface 540a is formed in the curved shape in the cross-sectional view. This is advantageous for wide light distribution.

A surface of the light-transmissive member 540 includes, outward of the inclined surface 540a, a flat surface 540b being a part of a lateral surface of the light emitting device 2. For example, the flat surface 540b is perpendicular to the lower surface 20b of the light source 520. However, the flat surface 540b is not limited to being perpendicular, and may be inclined with respect to the lower surface 20b of the light source 520. The flat surface 540b preferably has a height higher than a height of the light source 520 with reference to the lower surface 20b of the light source 520. Light emitted from the light source 520 toward the flat surface 540b exits from the flat surface 540b in the lateral direction of the light emitting device 2.

The surface of the light-transmissive member 540 preferably has a recessed portion 540x (i.e., second recessed portion) recessed to the light source 520 side in a region overlapping the encapsulant 530 in plan view. The recessed portion 540x preferably has a deepest portion located at the center of the recessed portion 540x in plan view. An inner surface 540c of the light-transmissive member 540 that defines the recessed portion 540x is preferably axisymmetric in a cross section including a central axis that passes through the center of the recessed portion 540x. The recessed portion 540x defines, for example, a cone shape or a frustum shape. The recessed portion 540x has, for example, a rectangle shape in plan view. The recessed portion 540x defines, for example, a quadrangular pyramid shape or a truncated pyramid shape. The center of the recessed portion 540x preferably matches the optical axis of the light source 520 in plan view.

In the cross-sectional view, the inner surface 540c may be linearly inclined, or may protrude and be curved toward the outside or the inside of a recess defined by the recessed portion 540x. Particularly, the inner surface 540c preferably protrudes and is curved toward the inside of the recess defined by the recessed portion 540x. When light from the light source 520 hits the inner surface 540c due to the inner surface 540c protruding and being curved toward the inside of the recess defined by the recessed portion 540x as illustrated in FIG. 20, light passing through the inner surface 540c can be reduced, and light reflected laterally in the light-transmissive member 540 can be increased. In this way, light emitted in the lateral direction of the light-transmissive member 540 can be increased. This is advantageous for wide light distribution.

The surface of the light-transmissive member 540 may include a flat surface 540d parallel to the lower surface 20b of the light source 520 between the inclined surface 540a and the inner surface 540c that defines the recessed portion 540x. One end side of the flat surface 540d is continuous with the inclined surface 540a, and the other end side is continuous with the inner surface 540c. When light from the light source 520 hits the flat surface 540d, a part of light passes through the flat surface 540d, and another part of light is reflected by the flat surface 540d and is directed laterally in the light-transmissive member 540.

Note that it is not necessary that the surface of the light-transmissive member 540 has the recessed portion 540x recessed to the light source 520 side. For example, there may be no recessed portion at a position of the recessed portion 540x in FIG. 20, and the light-transmissive member 540 may have a flat surface continuous with the flat surface 540d. In this case, when light from the light source 520 hits the flat surface 540d and the flat surface that is continuous with the flat surface 540d, a part of the light is reflected by the flat surface and is directed laterally in the light-transmissive member 540.

The light emitting device 2 according to the second embodiment has the following characteristics.

The light emitting device 2 includes a light source, an encapsulant that covers a light emitting surface and a lateral surface of the light source, and a light-transmissive member that covers an upper surface and a lateral surface of the encapsulant. The light-transmissive member has an octagon shape in plan view. All interior angles of the octagon are less than 180 degrees, and the interior angles have different angles. The sides of the octagon have equal lengths. A surface of the light-transmissive member includes an inclined surface having a height on a peripheral end side lower than a height on a center side with reference to a lower surface of the light source. The inclined surface is provided in an annular shape outside the encapsulant in plan view. The inclined surface has a linear shape when viewed in a cross-sectional view. The surface of the light-transmissive member has, outside the inclined surface, a flat surface perpendicular to the lower surface of the light source.

The flat surface of the light-transmissive member has a height higher than a height of the light source with reference to the lower surface of the light source. The light-transmissive member includes a recessed portion recessed to the light source side in a region overlapping the encapsulant in plan view. The recessed portion defines a cone shape or a frustum shape.

In the cross-sectional view, an inner surface of the light-transmissive member that defines the recessed portion protrudes and is curved toward the inside of the recess defined by the recessed portion. The recessed portion has a rectangle shape in plan view. The surface of the light-transmissive member has a flat surface parallel to the lower surface of the light source between the recessed portion and the inclined surface. The recessed portion is larger than the encapsulant in plan view.

The encapsulant has a rectangle shape in plan view. The encapsulant contains a resin and particles of a phosphor. The light source has a rectangle shape smaller than the encapsulant in plan view. In plan view, each vertex of the rectangle shape of the encapsulant is located on an extended line of a diagonal line of the rectangle shape of the light source.

The octagon shape has four first vertices inscribed in a circle, and other four second vertices located in a region surrounded by a chord and an arc determined by the circumferentially adjacent first vertices. The first vertex is located on the extended line of the diagonal line of the rectangle shape of the light source in plan view.

Similarly to the first embodiment, the plurality of light emitting devices 2 according to the second embodiment can also be arranged to be used as a planar light source. By using, for a backlight light source, the light emitting device 1 according to the first embodiment or the light emitting device 2 according to the second embodiment as the planar light source, a liquid crystal display device can also be obtained.

The method for manufacturing the light emitting device 1 according to the first embodiment can also be applied to the method for manufacturing the light emitting device 2 according to the second embodiment.

Although preferred embodiments and the like have been described in detail above, the disclosure is not limited to the above-described embodiments and the like, and various modifications and substitutions can be made to the above-described embodiments and the like without departing from the scope described in the claims.

What is claimed is:

1. A method for manufacturing a light emitting device, the method comprising:
    providing an intermediate member including:
        a support member including:
            a plurality of housing portions, at least one of the housing portions having a first recessed portion that has a lateral wall and a bottom surface, and
            a coupling portion located between the at least one of the housing portions and an adjacent one of the housing portions and having a height lower than a height of the lateral wall with reference to the bottom surface of the first recessed portion,
        a substrate, and
        a second light-transmissive member that has a through hole and is disposed on the substrate, wherein
        the first recessed portion is defined by an upper surface of the substrate and a lateral wall of the second light-transmissive member that defines the through hole, and
        a light source mounted on the bottom surface of the first recessed portion, and
        an encapsulant disposed in the first recessed portion and covering the light source; and
    forming a first light-transmissive member that continuously covers at least one of the housing portions and the coupling portion, wherein
    a surface of the first light-transmissive member has an inclined surface straddling the at least one of the housing portions and the coupling portion,
    wherein the inclined surface is inclined such that a height above a coupling portion side is lower than a height above at least one of the housing portions side with reference to the bottom surface of the first recessed portion.

2. The method for manufacturing a light emitting device according to claim 1, further comprising
    after the forming the first light-transmissive member, cutting the coupling portion and a portion of the first light-transmissive member that covers the coupling portion.

3. The method for manufacturing a light emitting device according to claim 1, wherein,
    the providing the intermediate member includes
        providing the light source mounted on the bottom surface of each of the first recessed portions of the support member, and
        disposing the encapsulant to cover the light source in each of the first recessed portions.

4. The method for manufacturing a light emitting device according to claim 3, wherein the providing the intermediate member includes mounting the light source on the bottom surface of each of the first recessed portions of the support member.

5. The method for manufacturing a light emitting device according to claim 1, wherein
    the providing the support member includes
        providing the substrate, and
        disposing the second light-transmissive member on the substrate.

6. The method for manufacturing a light emitting device according to claim 1, comprising:
    disposing the second light-transmissive member in a semi-cured state and the first light-transmissive member in an uncured state that covers the second light-transmissive member, and
    curing the second light-transmissive member and the first light-transmissive member.

7. The method for manufacturing a light emitting device according to claim 1, wherein
    the first light-transmissive member and the second light-transmissive member are formed of the same material.

8. The method for manufacturing a light emitting device according to claim 1, wherein
    the coupling portion has a grid shape in a plan view.

9. The method for manufacturing a light emitting device according to claim 1, wherein
    a portion of the inclined surface having a lowest height from the bottom surface of the first recessed portion is lower than a height of the lateral wall of the at least one of the housing portions.

10. The method for manufacturing a light emitting device according to claim 1, wherein
    the encapsulant is formed of a resin containing particles of a phosphor, and
    the disposing the encapsulant includes disposing, in the first recessed portion, the resin in an uncured state containing the particles of the phosphor, and settling the particles of the phosphor on a bottom surface side of the first recessed portion.

11. The method for manufacturing a light emitting device according to claim 1, wherein,
    in the forming the first light-transmissive member, the inclined surface is formed linearly in a cross-sectional view.

12. The method for manufacturing a light emitting device according to claim 1, wherein,
    in the forming the first light-transmissive member, a second recessed portion recessed to a light source side is formed in a region overlapping the first recessed portion in a plan view.

13. The method for manufacturing a light emitting device according to claim 12, wherein
    the second recessed portion has a cone shape or a frustum shape.

14. The method for manufacturing a light emitting device according to claim 1, wherein
    a planar shape of the light source is a rectangular shape, and a planar shape of the first recessed portion is a rectangular shape larger than the planar shape of the light source.

15. The method for manufacturing a light emitting device according to claim 1, wherein
    the first light-transmissive member is formed of a resin and is formed by transfer molding.

16. The method for manufacturing a light emitting device according to claim 1, wherein
    the first light-transmissive member is formed of a resin and is formed by compression molding.

17. The method for manufacturing a light emitting device according to claim 1, wherein
    the first light-transmissive member and the second light-transmissive member are formed of the same resin.

* * * * *